(12) United States Patent
Herrmann et al.

(10) Patent No.: US 10,290,782 B2
(45) Date of Patent: May 14, 2019

(54) METHOD FOR MIRROR-COATING LATERAL SURFACES OF OPTICAL COMPONENTS FOR USE IN OPTOELECTRONIC SEMICONDUCTOR BODIES, AND OPTOELECTRONIC SEMICONDUCTOR BODY WHICH CAN BE MOUNTED ON SURFACES

(71) Applicant: OSRAM Opto Semiconductors GmbH, Regensburg (DE)

(72) Inventors: Siegfried Herrmann, Neukirchen (DE); David O'Brien, Bad Abbach (DE); David Racz, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 12 days.

(21) Appl. No.: 15/573,466

(22) PCT Filed: May 6, 2016

(86) PCT No.: PCT/EP2016/060212
§ 371 (c)(1),
(2) Date: Nov. 12, 2017

(87) PCT Pub. No.: WO2016/180734
PCT Pub. Date: Nov. 17, 2016

(65) Prior Publication Data
US 2018/0114887 A1   Apr. 26, 2018

(30) Foreign Application Priority Data

May 13, 2015   (DE) .................. 10 2015 107 590

(51) Int. Cl.
*H01L 21/46*   (2006.01)
*H01L 33/60*   (2010.01)
(Continued)

(52) U.S. Cl.
CPC ............ *H01L 33/60* (2013.01); *H01L 33/005* (2013.01); *H01L 33/46* (2013.01); *H01L 33/50* (2013.01);
(Continued)

(58) Field of Classification Search
CPC ....... H01L 2924/00; H01L 2924/00014; H01L 2924/12041; H01S 5/0201
(Continued)

(56) References Cited

U.S. PATENT DOCUMENTS 5,952,681 A * 9/1999 Chen ..................... H01L 27/153
257/88
7,329,587 B2 * 2/2008 Bruederl ........... H01L 21/76254
257/79

(Continued)

FOREIGN PATENT DOCUMENTS

DE   102005040558 A1   3/2007
DE   102011013821 A1   9/2012
(Continued)

*Primary Examiner* — Jonathan Han
(74) *Attorney, Agent, or Firm* — Slater Matsil, LLP

(57) ABSTRACT

A method for mirror-coating lateral surfaces of optical components, a mirror-coated optical component and an optoelectronic semiconductor body mountable on surface are disclosed. In an embodiment, an optoelectronic semiconductor body includes a semiconductor chip having a radiation side and a contact side different from the radiation side, wherein contact elements for electrically contacting the semiconductor body are attached to the contact side, and wherein the contact elements are freely accessible. The body further includes a metal mirror layer disposed on the semiconductor chip, wherein the metal mirror layer has a reflectivity of at least 80% to radiation emitted by the semiconductor chip during operation, wherein the mirror layer is a continuous and contiguous mirror layer, which covers all sides of the semiconductor chip that are not the contact side (Continued)

and the radiation side by at least 95%, and wherein the mirror layer is arranged at the semiconductor chip in a form-fit manner.

18 Claims, 17 Drawing Sheets

(51) Int. Cl.
*H01L 33/46* (2010.01)
*H01L 33/00* (2010.01)
*H01L 33/50* (2010.01)
*H01L 21/56* (2006.01)

(52) U.S. Cl.
CPC .. *H01L 21/568* (2013.01); *H01L 2224/04105* (2013.01); *H01L 2224/19* (2013.01); *H01L 2224/24* (2013.01); *H01L 2224/82* (2013.01); *H01L 2924/18162* (2013.01); *H01L 2933/0025* (2013.01); *H01L 2933/0058* (2013.01)

(58) Field of Classification Search
USPC ............... 257/76, 98–99; 438/27–28, 34
See application file for complete search history.

(56) References Cited

U.S. PATENT DOCUMENTS

| | | | |
|---|---|---|---|
| 7,906,352 B2 | 3/2011 | Brunner et al. | |
| 9,076,941 B2 | 7/2015 | Herrmann et al. | |
| 9,761,772 B2 | 9/2017 | Pfeuffer | |
| 2009/0093075 A1* | 4/2009 | Chu | H01L 33/0079 438/33 |
| 2011/0297987 A1* | 12/2011 | Koizumi | H01L 33/44 257/98 |
| 2014/0051194 A1* | 2/2014 | Herrmann | H01L 33/0079 438/27 |
| 2015/0255692 A1* | 9/2015 | Pfeuffer | H01L 33/405 438/27 |

FOREIGN PATENT DOCUMENTS

| | | |
|---|---|---|
| DE | 102012102421 A1 | 9/2013 |
| DE | 102012107921 A1 | 3/2014 |
| DE | 102015101143 A1 | 7/2016 |
| WO | 2009075753 A2 | 6/2009 |
| WO | 2014033041 A1 | 3/2014 |

* cited by examiner

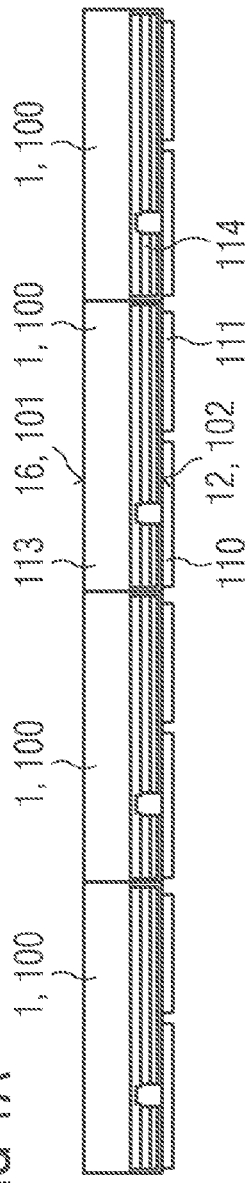
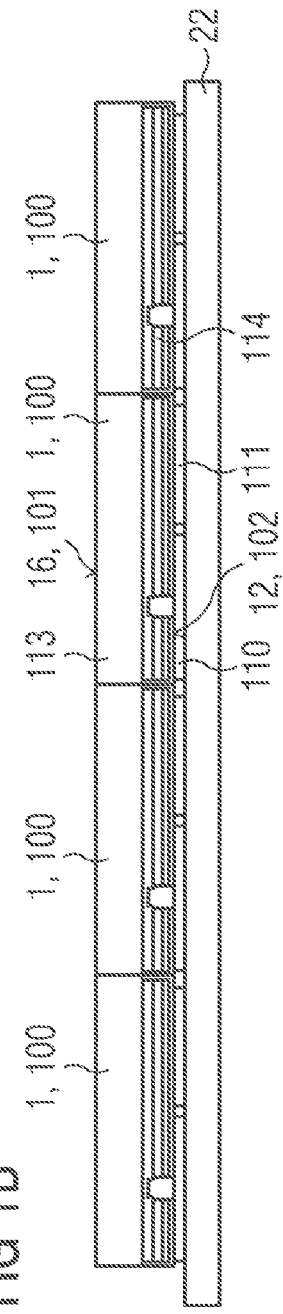
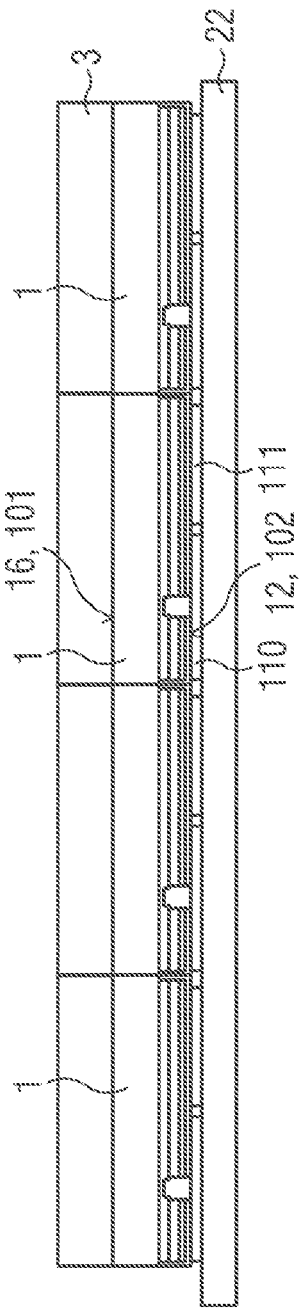

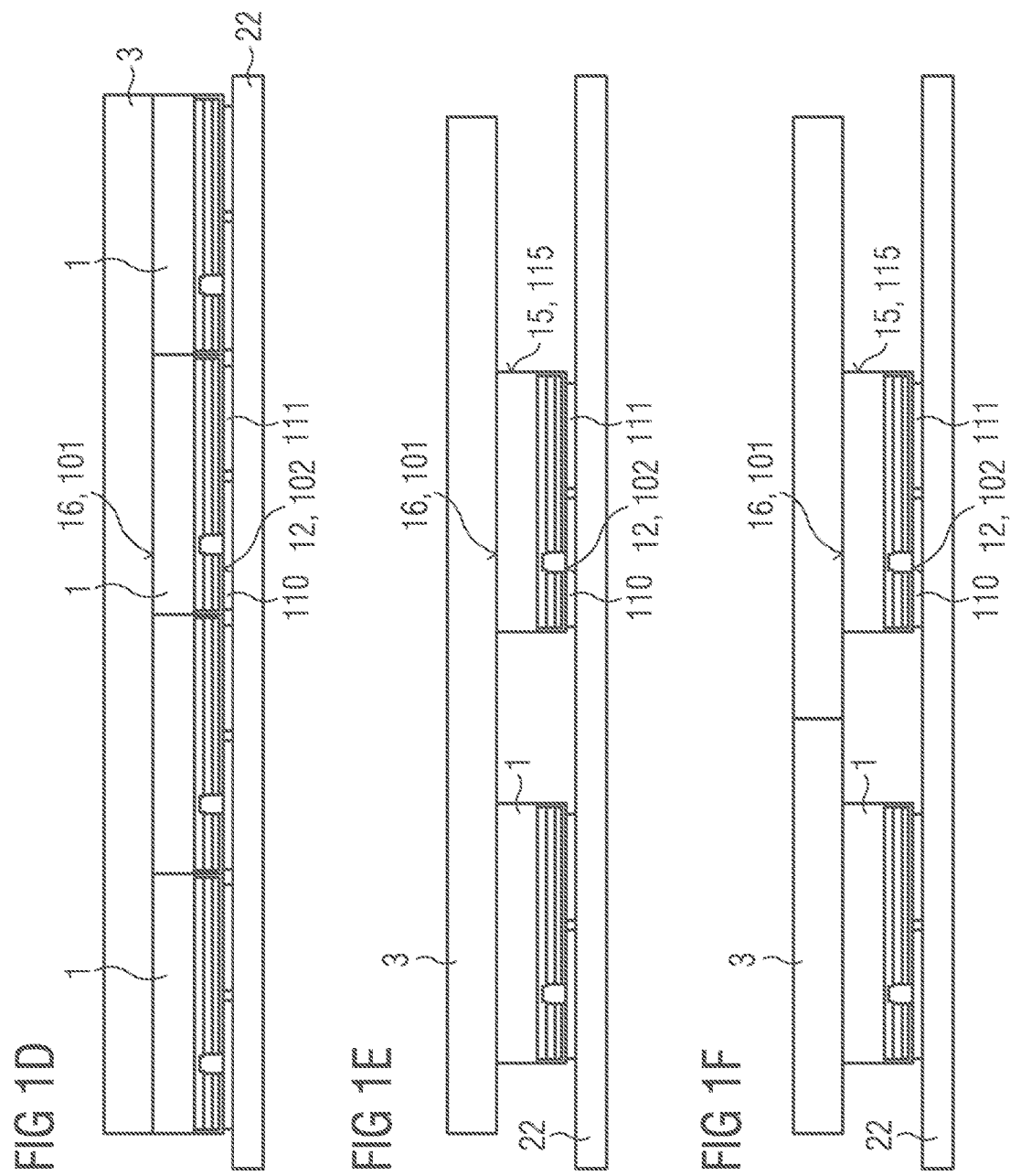

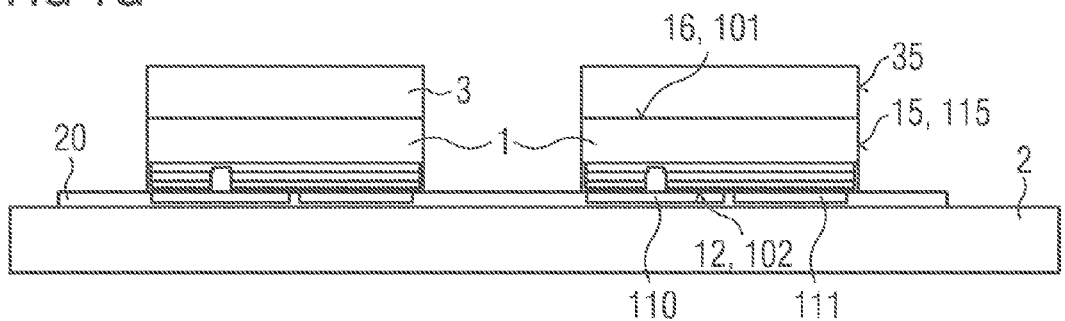
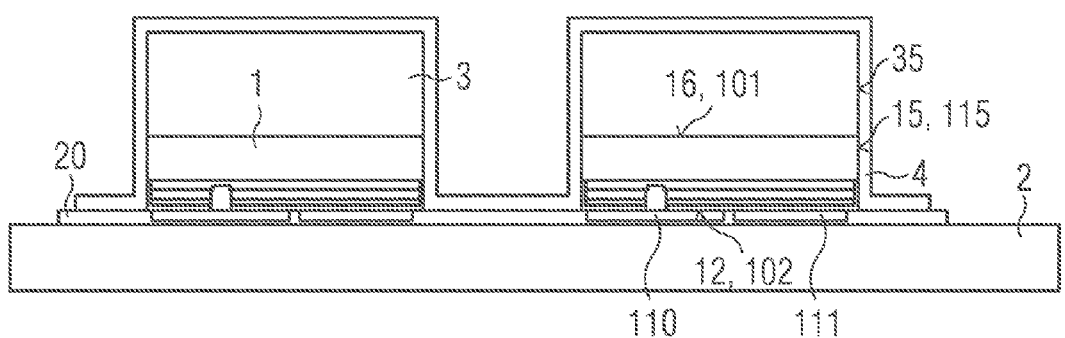
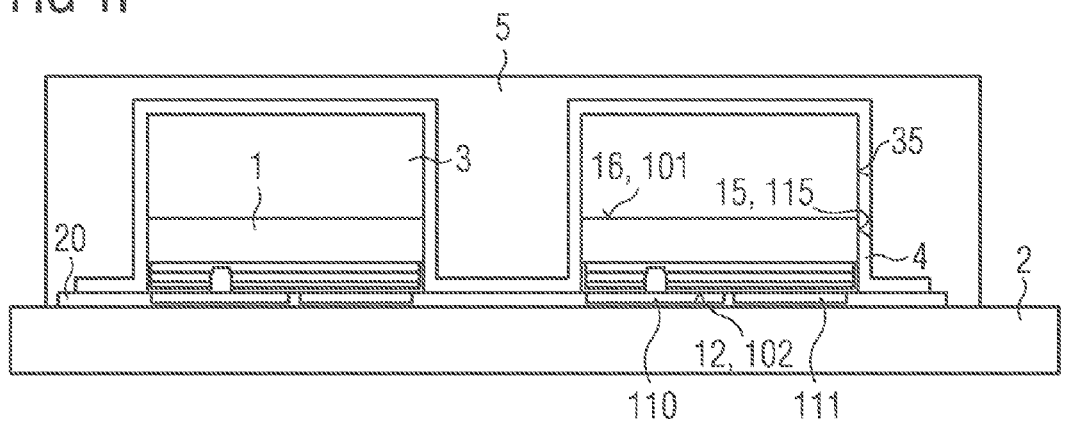

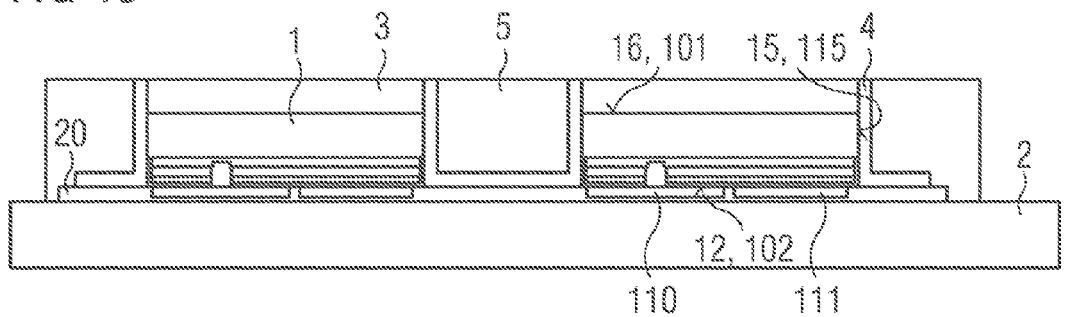
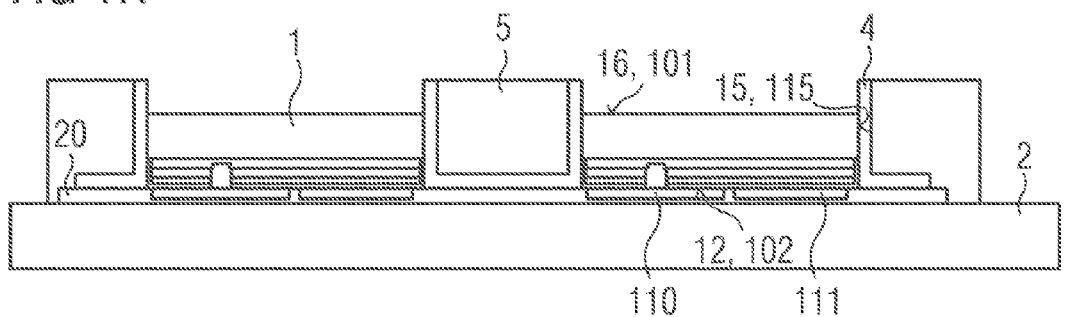
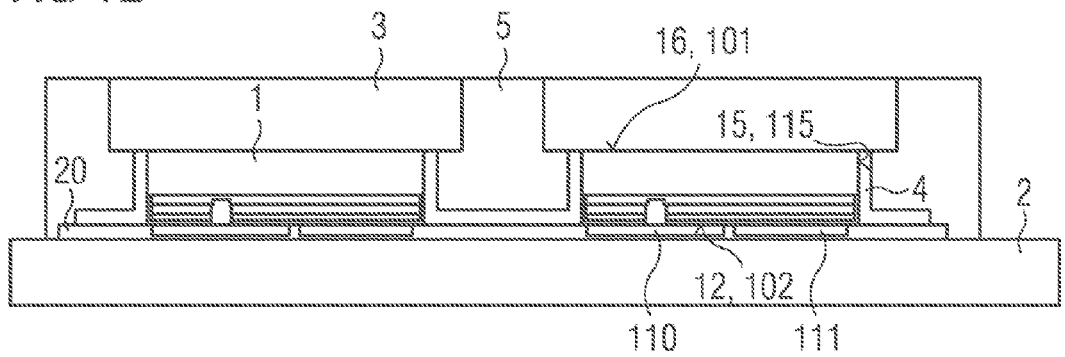

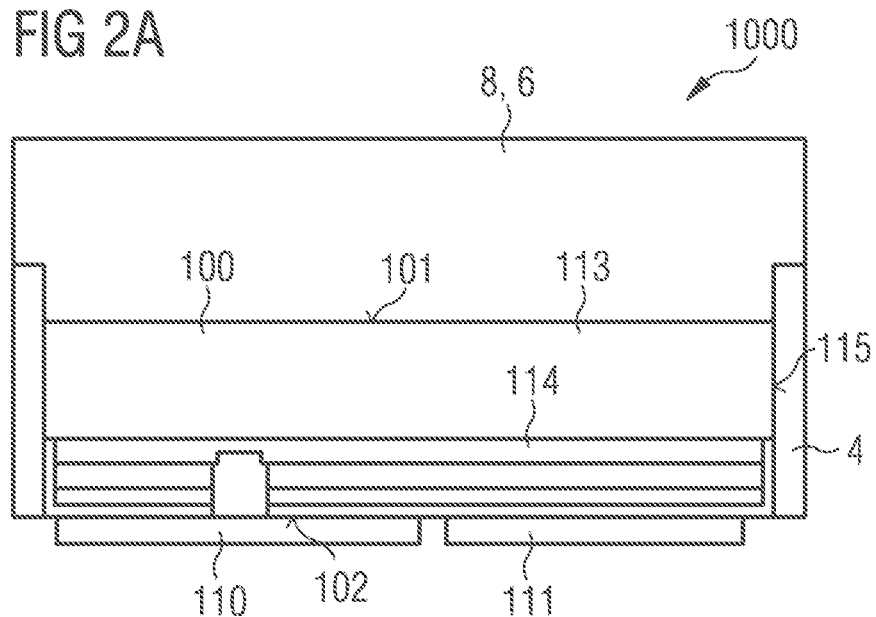
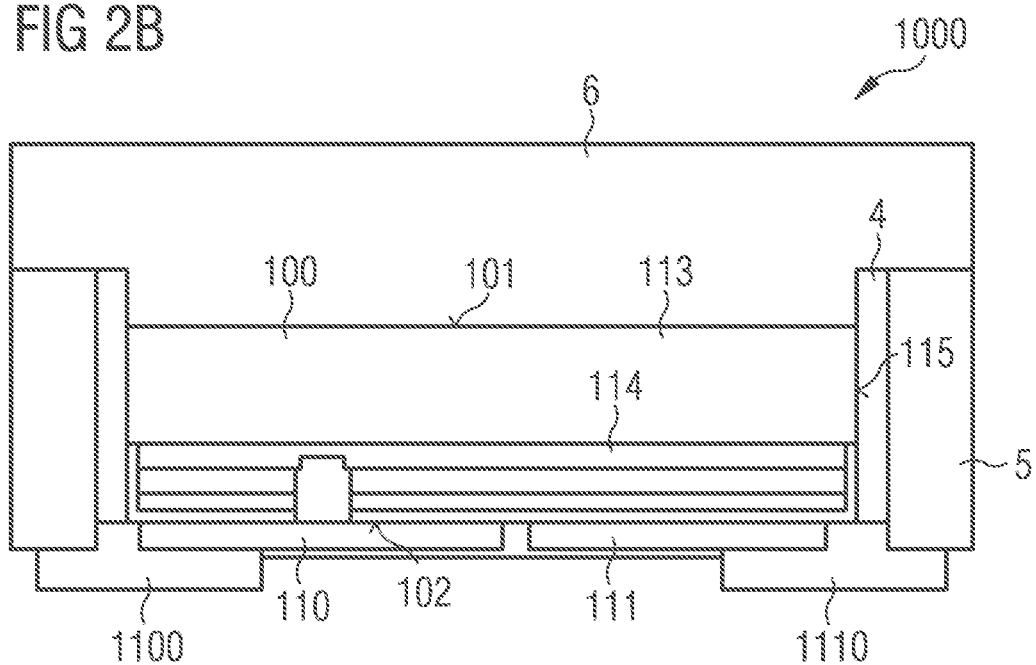

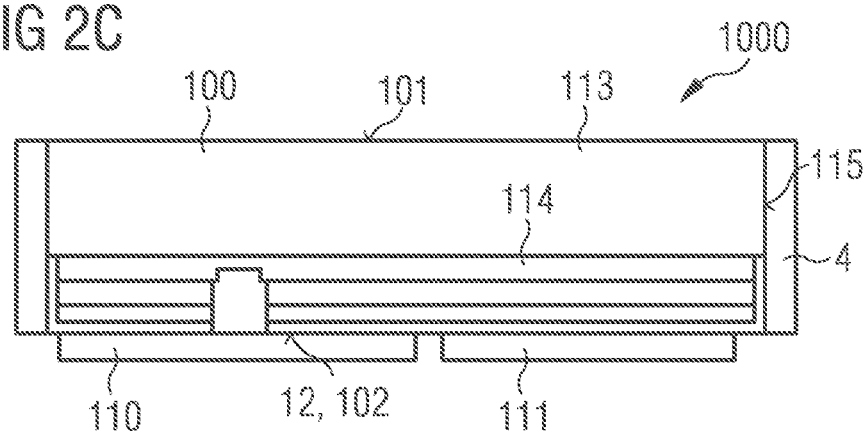
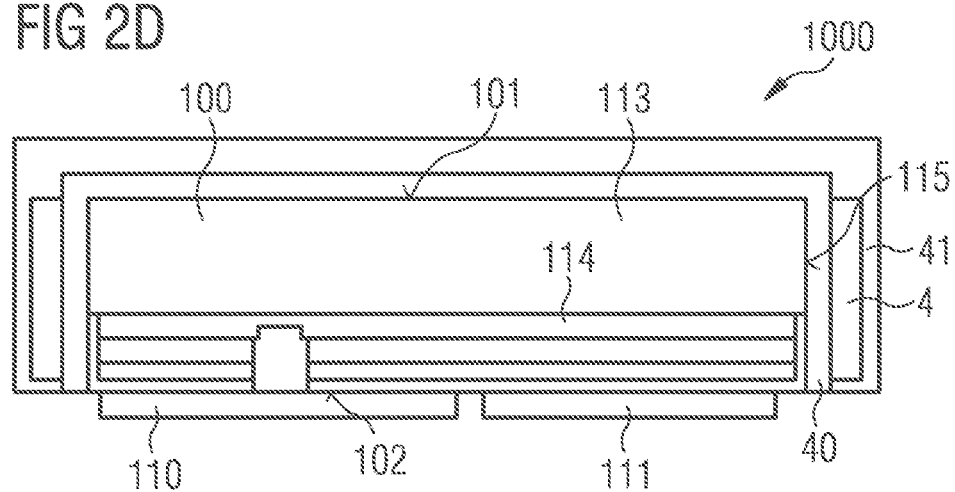
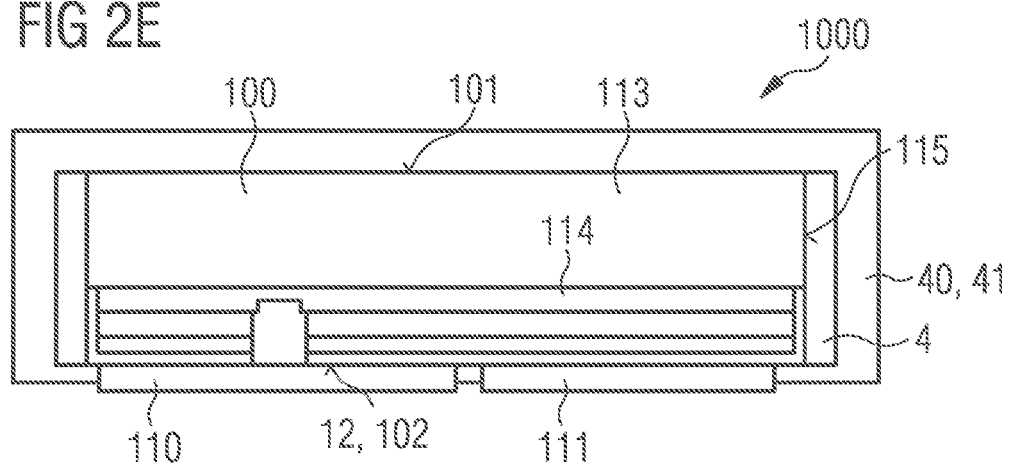

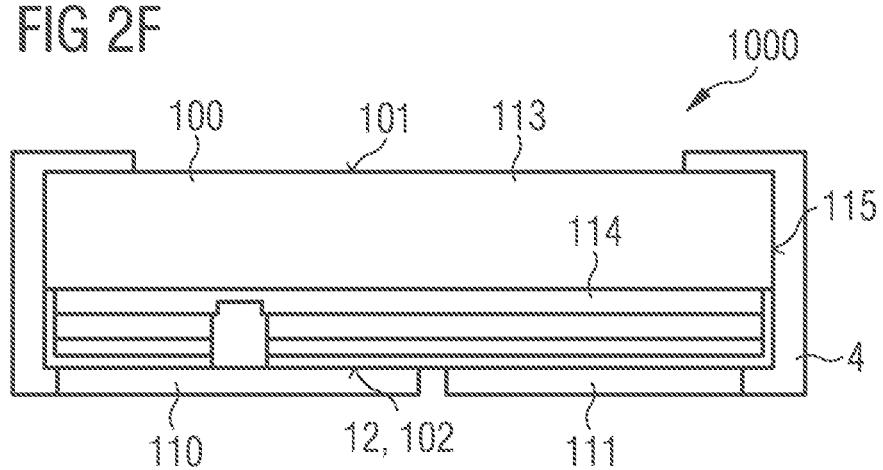
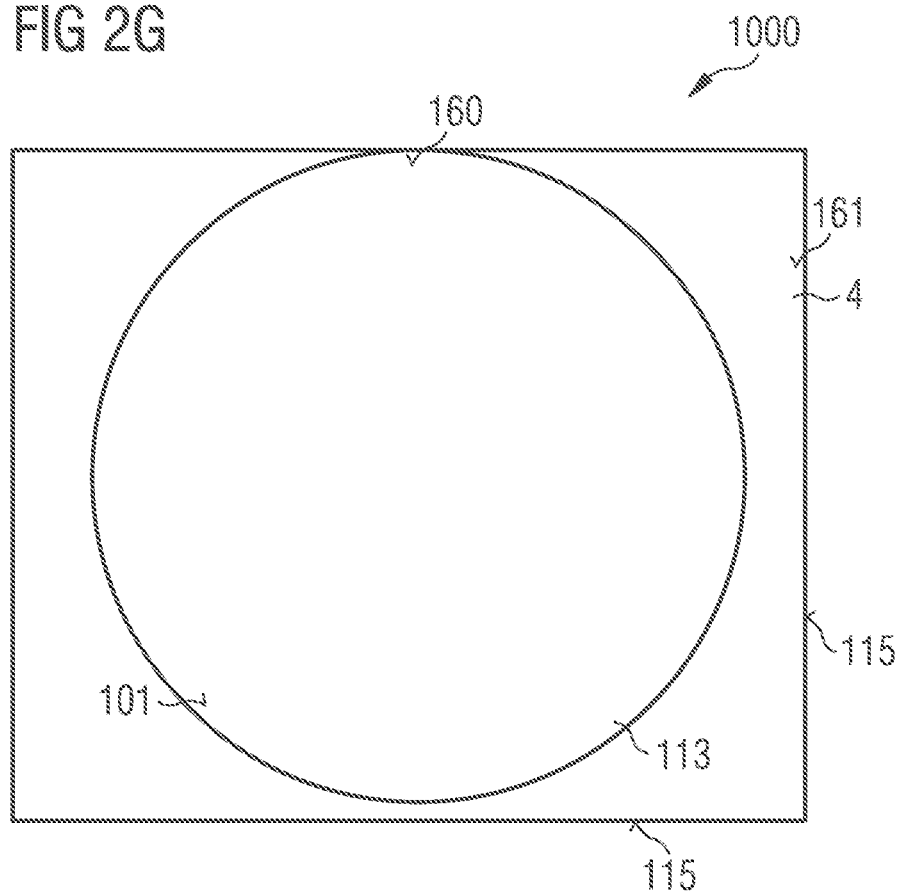

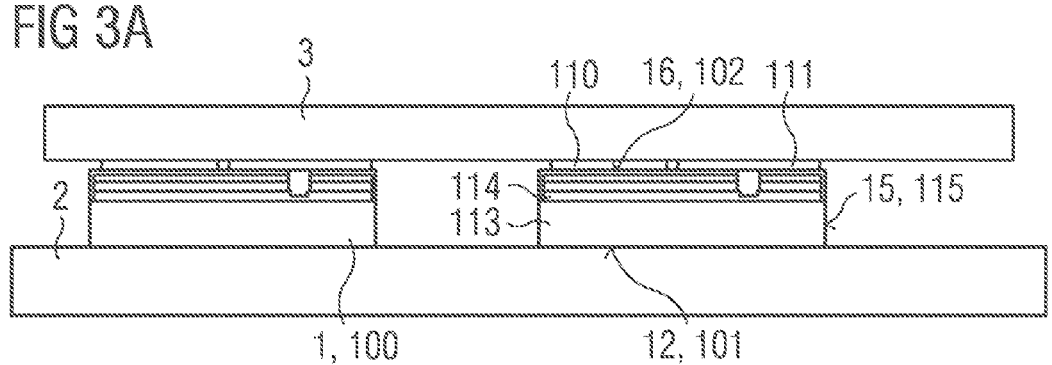
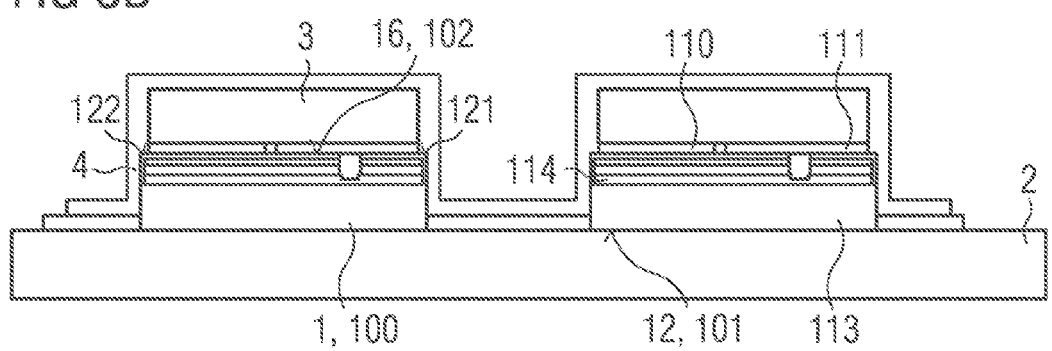
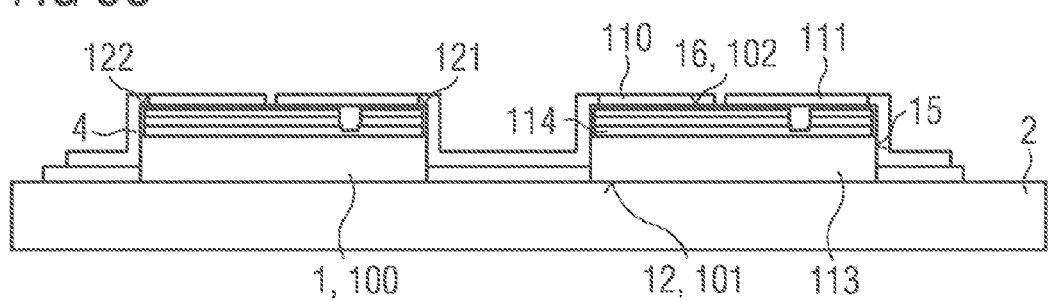
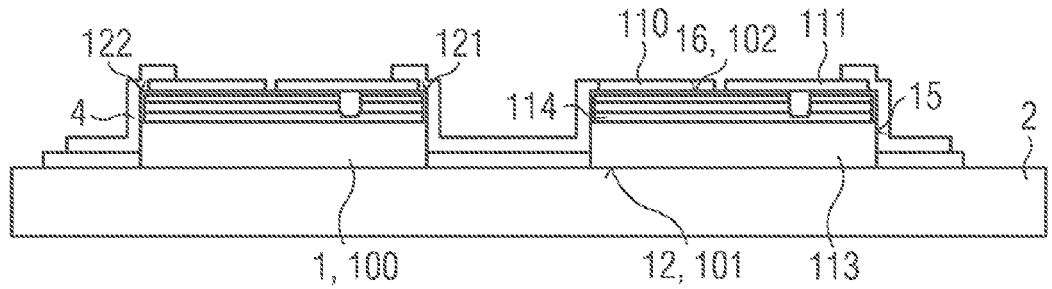

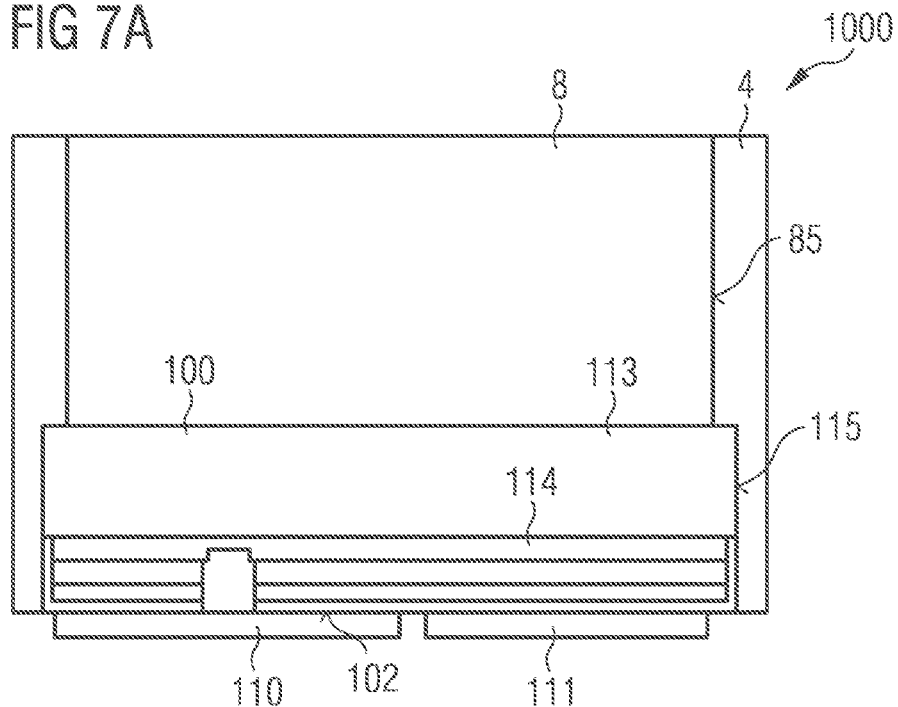
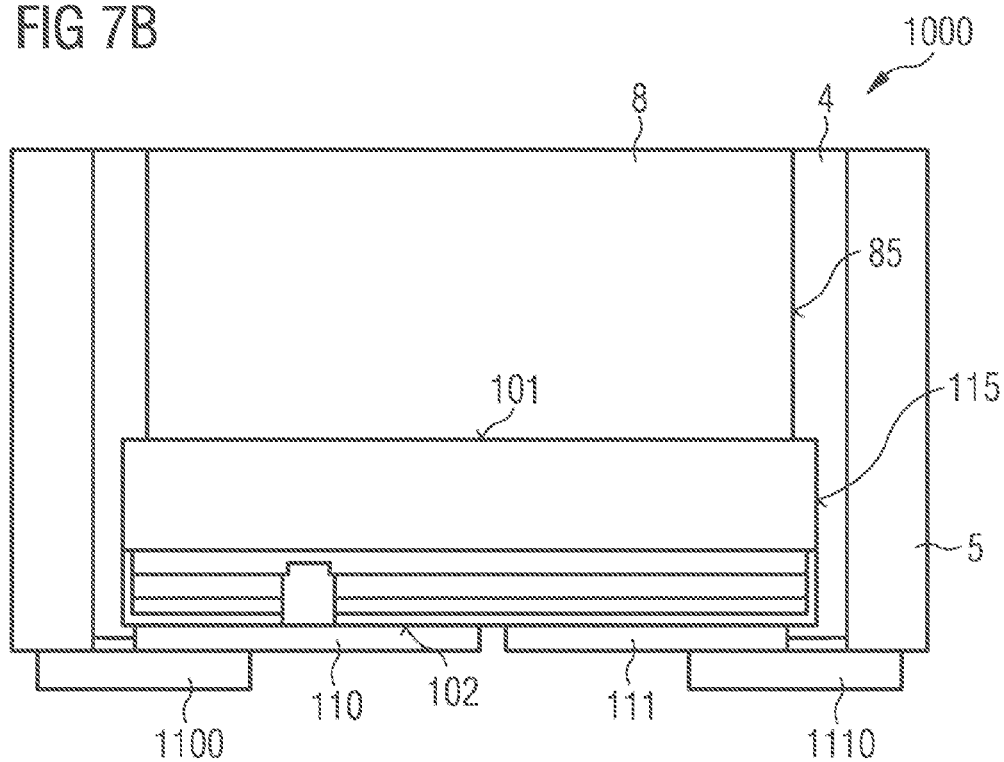

METHOD FOR MIRROR-COATING LATERAL SURFACES OF OPTICAL COMPONENTS FOR USE IN OPTOELECTRONIC SEMICONDUCTOR BODIES, AND OPTOELECTRONIC SEMICONDUCTOR BODY WHICH CAN BE MOUNTED ON SURFACES

This patent application is a national phase filing under section 371 of PCT/EP2016/060212, filed May 6, 2016, which claims the priority of German patent application 10 2015 107 590.3, filed May 13, 2015, each of which is incorporated herein by reference in its entirety.

TECHNICAL FIELD

A method for mirror-coating outside surfaces of optical components for use in optoelectronic semiconductor bodies is provided. Furthermore, a surface-mounted optoelectronic semiconductor body is provided.

SUMMARY OF THE INVENTION

Embodiments provide a method for mirror-coating outside surfaces of optical components. Further embodiments provide a surface-mounted optoelectronic semiconductor body, which comprises the mirror-coated outside surfaces.

According to at least one embodiment, the method for mirror-coating outside surfaces of optical components for use in optoelectronic semiconductor bodies includes a step A), in which a plurality of optical components is arranged on a carrier. The carrier is, for example, a glass carrier or a metal carrier or a semiconductor carrier or a plastic carrier or a Revalpha carrier. The components can, e.g., be optoelectronic semiconductor chips and/or optical elements such as glass bodies or lenses or prisms or converter elements. Each component has a front side, a rear side located opposite the front side, and side surfaces extending transversally to the front side. The optical component has the basic shape of a rectangular prism or a cylinder, for example. In the case of a cylinder, the component has only a single contiguous side surface then, for example.

According to at least one embodiment, in a step B), a sacrificial layer is applied on to each component so that in each component the front side is at least partly covered by the sacrificial layer. In this case, the sacrificial layer can be applied directly on to the optical component or further layers, such as passivation layers are applied on to the component prior to the application of the sacrificial layer.

The sacrificial layer may comprise or consist of a plastic or a photoresist such as a dry-resist. The thickness of the sacrificial layer on the front side is at least 10 μm or 20 μm or 30 μm, for example. As an alternative or in addition, the thickness is at least 70 μm or 60 μm or 50 μm.

According to at least one embodiment, the method includes a step C), in which a mirror layer is applied on to the components, so that the mirror layer partly or completely covers the sacrificial layer and all other sides of each component that are not covered by the carrier. The coverage of the mirror layer on the remaining sides of the components uncovered by the carrier is at least 90% or 95% or 99% or 100%, for example. In particular, the mirror layer extends continuously, contiguously and without interruptions on the components and rests against the components in a form-fit manner.

The mirror layer can, e.g., be applied by means of a sputtering process or a vapor deposition process or atomic layer deposition, ALD for short, or chemical vapor deposition, CVD for short, or via physical vapor deposition, PVD for short.

For example, the mirror layer comprises or consists of a metal or a metal alloy. The following materials are suitable as a constituent of the metal alloy, for example: Al, Ag, Au, Ti, Pt, Li, Na, Ka, Ru, Cs, Be, Ca, Mg, Sr, Ba, Sc, Si, Ga, Sn.

After application of the mirror layer, the mirror layer has a thickness of at least 50 nm or 100 nm or 200 nm. As an alternative or in addition, the thickness of the mirror layer is at most 1 μm or 500 nm or 300 nm.

According to at least one embodiment of the method, in a step D), the sacrificial layer is partly or completely removed from the front side of each component together with the mirror layer located thereon. In this case, the mirror layer remains on the other sides or regions of the components previously covered by the mirror layer. Therefore, after step D), each component in particular is completely mirror-coated with the mirror layer on all sides, except for the regions that were previously covered by the sacrificial layer or the carrier.

After step D), the mirror components can be removed from the carrier and be singulated. Preferably, the components having the mirror layer applied thereon are then per se self-supporting and mechanically stable. In particular, no potting material applied on to the components or no further carrier is required for mechanical stability.

In at least one embodiment, the method for mirror-coating outside surfaces of optical components for use in optoelectronic semiconductor bodies includes a step A), in which a multitude of optical components is arranged on a carrier, wherein each component comprises a front side, a rear side located opposite the front side, and side surfaces extending transversely to the front side. In a step B), a sacrificial layer is applied on to each component, so that in each component the front side is at least partly covered by the sacrificial layer. In a step C), a mirror layer is applied on to the components, so that the mirror layer at least partly covers the sacrificial layer and all sides of each component that are not covered by the carrier. In a step D), the sacrificial layer and a mirror layer located thereon are removed from the front side of each component, wherein the mirror layer remains on the remaining sides of the components previously covered by the mirror layer.

The method described herein allows producing mirror-coated optical components which are especially compact in terms of the (structural) design thereof. Due to the preferably metallic mirror layer, the components also have good thermal properties. A metal mirror-coat also prevents a degeneration of organic layers, which can be applied on to external surfaces of the mirror-coated components, for example. If, for example, a component is enclosed by a potting material later, the metal mirror layer can prevent the radiation emerging from the optical components from entering the potting material. Moreover, the radiation characteristic of the optical components and the radiating surface can exactly be defined by mirror-coating outside surfaces.

According to at least one embodiment, steps A) to D) are performed in the specified order.

According to at least one embodiment, in step A), the rear side of the component is made to face the carrier.

According to at least one embodiment, after step C) and prior to step D), a potting material is arranged in the regions between the components, so that the side surfaces and the mirror layer applied thereon of each component are laterally enclosed by the potting material in a form-fit manner. In particular, the potting material can also be brought into direct contact with the mirror layer. The components are preferably laterally embedded in the potting material.

The potting material can in particular be a plastic, such as a white plastic. For example, a silicone potting having radiation-reflecting particles such as titanium oxide particles embedded therein is conceivable. It is also possible that the potting material comprises or consists of at least one of the following materials or material classes: Omocer, epoxy resin, photoresist.

The potting material can be introduced between the components, e.g., by means of injection-molding or transfer-molding, or a spraying technique or a foil technique.

According to at least one embodiment, the potting material is introduced in such a way that the potting material projects above the components in the direction away from the carrier. For example, the potting material can at least partly cover and be in contact with side surfaces of the sacrificial layer. Here, the side surfaces of the sacrificial layer also extend transversally to the front side of the component.

According to at least one embodiment, in step D), the sacrificial layer is ground together with the potting material located at the same height above the carrier. In this case, the potting material also serves to enlarge the surface to be ground, which simplifies a grinding process. For example, the sacrificial layer is ground, so that the thickness of the sacrificial layer after the grinding process is at least 10 μm or 5 μm. The complete removal of the sacrificial layer after the grinding process can, e.g., be effected via a wet-chemical process.

When singulating the mirror-coated components after step D), the individual components can be separated from one another, e.g., along separation planes through the potting material. Thus, besides the mirror layer, the developing, individual mirrored components also comprise a potting material applied on to the side surfaces of the components, which, e.g., is arranged completely around all sides of the components. In this case, the potting material may have an additional mirror effect for the components.

According to at least one embodiment, the sacrificial layer is a photoresist which, e.g., first is applied on to all components and covers all sides of the components facing away from the carrier. Prior to step C), the photoresist can be patterned by means of a lithographical process, for example, whereby regions of the components that subsequently are to be free from the sacrificial layer and be mirror-coated with the mirror layer in step C) can be defined. In step D), the sacrificial layer, in particular when formed of a photoresist, can be removed from the components by a wet-chemical process. In this case, a grinding process can be omitted.

According to at least one embodiment, the sacrificial layer in each case only covers an inner region of the front sides of each of the components. An outer edge of the front side, which partly or completely surrounds the inner region, remains free of the sacrificial layer then. In step C, the mirror layer can be applied on to the outer edge and remains on the outer edge after step D). Using this method, e.g., a radiation exit window or a radiation entrance window can be defined at the front side of the components.

According to at least one embodiment, each component comprises or consists of an optoelectronic semiconductor chip. The optoelectronic semiconductor chip preferably comprises a contact side and a radiation side different from the contact side.

For example, contact elements for electrically contacting the semiconductor chip are attached on the contact side. In particular, all contact elements required for contacting the semiconductor chip are arranged on a single side of the semiconductor chip, namely on the contact side.

During the intended operation, e.g., electromagnetic radiation is coupled out of or coupled into the semiconductor chip via the radiation side. In particular, the radiation side is a main radiation side via which a large part or the entire radiation generated or absorbed by the semiconductor chip is coupled-out or coupled-in.

In this case, the contact side of the semiconductor chip corresponds to either the rear side or the front side or to one of the side surfaces of the optical component.

For example, the semiconductor chip can be a volume emitter, in which a semiconductor layer sequence is grown on to a growth substrate and in which the growth substrate is the stabilizing component in the semiconductor chip. In particular, the growth substrate is a sapphire growth substrate, and the semiconductor layer sequence is a semiconductor layer sequence based on AlInGaN. Preferably, the contact side is then formed on a side of the semiconductor layer sequence facing away from the growth substrate.

However, as an alternative, it is also possible that the semiconductor chip is a thin film semiconductor chip, in which a substrate stabilizing the semiconductor layer sequence is different from the growth substrate for the semiconductor layer sequence and which has the growth substrate removed. In this case, the contact side is preferably formed on a side of the substrate facing away from the semiconductor layer sequence.

According to at least one embodiment, a connecting layer is applied on to the carrier. The connecting layer extends preferably continuously, without interruptions and contiguously along the carrier. For example, the connecting layer can comprise or consist of a thermoplastic material. A thickness of the connecting layer is preferably between 5 μm and 30 μm inclusive.

According to at least one embodiment, the contact sides of the semiconductor chips correspond to the rear side or one of the side surfaces of the components, respectively.

According to at least one embodiment, during the arrangement in step A), the contact sides of the semiconductor chips are made to face the carrier and the contact elements are pressed into the connecting layer deep enough that the contact elements, in step C), are prevented from being covered by the mirror layer. In particular, the contact elements are pressed completely into the connecting layer.

For pressing the contact elements into the connecting layer, the connecting layer can be heated to a predetermined temperature, for example, at which the connecting layer softens and thus becomes deformable.

According to at least one embodiment, the radiation side is located opposite the contact side. After step D), a converter element is applied on to the radiation side, for example. For example, the converter element can be applied or laminated on to the radiation side of the semiconductor chips by a spraying process or as a foil or potting material. On the radiation side of the semiconductor chip, the converter element has, e.g., a thickness of at least 20 μm or 30 μm or 40 μm. As an alternative or in addition, the thickness of the converter element is 100 μm or 70 μm or 60 μm at the most. In particular, the converter element is configured to convert the radiation emitted by the semiconductor chip completely or partly into radiation of a different wavelength range, e.g., into visible light.

According to at least one embodiment, the contact side of the semiconductor chip corresponds in each case to the front side of the component. During the arrangement in step A), the contact side of the semiconductor chip can face away from the carrier.

According to at least one embodiment, the sacrificial layer is applied on to the contact sides in step D) in such a way that in each case an edge region of the contact sides adjacent to the side surfaces of the semiconductor chips remains free of the sacrificial layer. The edge region of the contact side extends, e.g., completely around an inner region of the contact side. For example, the width of the edge region, in each case measured perpendicular to the side surfaces, is at least 2 µm or 5 µm or 10 µm. As an alternative or in addition, the width of the edge region is 5 µm or 20 µm or 15 µm at most.

According to at least one embodiment, after step D), a mirror layer formed contiguously and in one piece remains on each semiconductor chip, the mirror layer in each case covering the side surfaces of the semiconductor chip and the edge region of the contact side, in particular in each case with one of the above-mentioned coverages.

According to at least one embodiment, the carrier is a converter element, e.g., a ceramic converter element, which is self-supporting and mechanically stable. In step A), the semiconductor chips can be attached on to the carrier, e.g., in a mechanically stable and permanent manner. In particular, this is advantageous when the radiation surfaces of the semiconductor chips are made to face the carrier, since they are covered with a converter element as early as in step A). After step D), the carrier can be singulated between the semiconductor chips, for example, so that each semiconductor chip comprises a distinct converter element.

According to at least one embodiment, the contact elements are placed back from chip edges formed between the side surfaces of the semiconductor chip and the contact surface by at least 5 µm or 10 µm or 100 µm or 200 µm.

According to at least one embodiment, the mirror layer is applied on to the contact side in such a way that, after step D), it extends all the way until on to the contact elements and covers a part of the contact elements. In this case, the mirror layer covers between 10% and 50%, inclusive, of the contact elements, for example.

According to at least one embodiment, each component includes an optical element besides the semiconductor chip. The optical element is, e.g., arranged in the radiation side of the semiconductor chips and serves for converting radiation and/or guiding radiation. For example, the optical element is a converter element, e.g., a ceramic converter element, or a beam-guiding element, e.g., a lens or a cylinder or a prism, e.g., of a transparent, clears-sighted material such as glass. The optical element can, e.g., also serve as a transition element for coupling radiation emerging from the semiconductor chip into a light guide.

According to at least one embodiment, the contact side of the semiconductor chip corresponds to the rear side or one of the side surfaces of the optical component. The front side of the component is than preferably formed by a side of the optical element facing away from the semiconductor chip.

According to at least one embodiment, in step C), besides side surfaces of the semiconductor chip, side surfaces of the optical element extending transversally to the front side are also mirror-coated with the mirror layer, e.g., with one of the above-mentioned coverages.

According to at least one embodiment, prior step C), a first passivation layer is applied on to the components. The passivation layer preferably is a layer made of a transparent material, e.g., a ZnO layer or a SiO$_2$ layer or a plastic layer or a parylene layer. However, a layer combination of multiple individual layers is also conceivable. The layer thickness of the first passivation layer is, e.g., at least 50 nm or 100 nm or 150 nm. As an alternative or in addition, the layer thickness of the first passivation layer is 500 nm or 400 nm or 300 nm at the most.

The first passivation layer particularly serves to prevent a direct mechanical contact between the mirror layer and the components. For example, the first passivation layer serves as an adhesive between the mirror layer and the component. It is also possible that the first passivation layer prevents short-circuits in the component, which could possibly occur due to an electric contact of the mirror layer with contact elements of the components. Preferably, together with the mirror layer, the first passivation layer forms a Bragg mirror for radiation emerging from the component.

According to at least one embodiment, after step D), a second passivation layer is applied on to the components, which completely encapsulates the mirror layer. In this case, the second passivation layer particularly serves for protecting the mirror layer against external influence, such as moisture. The second passivation layer can also consist of a multitude of stacked layers. Possible materials comprising or consisting of the second passivation layer or individual layers of the second passivation layers are, for example: Parylene, SiN, Al$_2$O$_3$, Siloxanes, such a Hexamethyldisiloxane, HMDSO, for short, metals. The layer thickness of the second passivation layer is, e.g., between 0.5 µm and 5 µm inclusive.

Furthermore, a surface-mounted optoelectronic semiconductor body is provided. The optoelectronic semiconductor body can be produced in particular by means of the method described herein. In other words, all features disclosed in conjunction with the method are also disclosed for the optoelectronic semiconductor body and vice versa.

According to at least one embodiment, the semiconductor body comprises a semiconductor chip having a radiation side and a contact side different from the radiation side, on which contact elements for electrically contacting the semiconductor body are attached. In this case, the contact elements of the semiconductor body are freely accessible, i.e., are exposed on the unmounted semiconductor body. In particular, all contact elements required for contacting the semiconductor body are located on a single side of the semiconductor body, namely the contact side.

According to at least one embodiment, a metal mirror layer is applied on to the semiconductor chip, which has a reflectivity of at least 80% or 90% or 95% for radiation emitted by the semiconductor chip during the operation.

According to at least one embodiment, the mirror layer is a contiguous and contiguous mirror layer that covers all sides of the semiconductor chip not configured as the contact side and radiation side by at least 95%. The mirror layer preferably rests against the semiconductor chip in a form-fit manner and can also be in direct contact with the semiconductor chip.

The lateral and/or vertical extent of the optoelectronic semiconductor body preferably deviate from the lateral and vertical extent of the optoelectronic semiconductor chip by no more than 15% or 10% or 5%.

According to at least one embodiment, an optical element for converting radiation and/or guiding radiation is attached on the radiation side of the semiconductor chip. The optical element can terminate flush with the mirror layer in a lateral direction parallel to the radiation side or project laterally from the mirror layer. As an alternative or in addition, it is possible that the optical element is per se mirror-coated with the mirror layer on side surfaces extending transversally to the radiation side.

According to at least one embodiment, in the semiconductor chip, the contact side and the radiation side are located opposite one another and are connected to one another via side surfaces of the semiconductor chip extending transversally to the radiation side. For example, a potting material with a layer thickness of at least 10 µm or 20 µm or 50 µm can be applied on to the side surfaces of the semiconductor chips. As an alternative or in addition, the layer thickness of the potting material is 100 µm or 70 µm or 60 µm at the most. In this case, the mirror layer is embedded between the semiconductor chip and the potting material. In particular, the potting material comprises a white plastic, which is, e.g., also reflective to the radiation emitted by the semiconductor chip.

According to at least one embodiment, the potting material and the mirror layer project above the semiconductor chip by, e.g., at least 3 µm or 5 µm or 10 µm in the direction away from the radiation side.

According to at least one embodiment, the optical element is a converter element which is configured to convert at least part of or the entire radiation emitted by the semiconductor chip during operation into radiation of a different wavelength range, e.g., into visible light.

According to at least one embodiment, the converter element terminates flush with the potting material. Furthermore, the converter element preferably rests against the semiconductor chip and the potting material in a form-fit manner and is in direct contact with it, for example.

According to at least one embodiment, the mirror layer is guided all the way until on an edge region of the contact side adjacent to side surfaces of the semiconductor chip and covers the entire edge region. For example, the edge region is a continuous, contiguous edge without interruptions on the contact side, which extends completely around the contact elements. In this case, the edge region has a width of at least 5 µm, for example.

According to at least one embodiment, the optical element is mirrored with the mirror layer on side surfaces of the optical element extending transversally to the radiation side. In this case, the mirror layer can cover all side surfaces of the optical element with one of the above-mentioned coverages. In particular, the optical element is a light outcoupling element for guiding radiation and may serve for coupling electromagnetic radiation emerging from the semiconductor chip into a light guide.

According to at least one embodiment, regions of the radiation side of the semiconductor chip that are not covered by the optical element are mirror-coated with the mirror layer. This particularly means that radiation can enter only into the optical element from the radiation side, radiation does not emerge from the radiation side laterally next to the optical element.

According to at least one embodiment, the radiation side extends transversally to the contact side and borders the contact side. The main radiation direction of the semiconductor body perpendicular to the radiation side extends parallel to the contact side then. In many cases, such an optoelectronic semiconductor body is referred to as a sidelooker.

BRIEF DESCRIPTION OF THE DRAWINGS

A method described herein for mirror-coating outside surfaces of optical components for the use in optoelectronic semiconductor bodies as well as a surface-mounted optoelectronic semiconductor body will be explained in greater detail by means of exemplary embodiments with reference to the drawings. The same elements are indicated with the same reference numerals throughout the figures. However, the drawings are not necessarily made to scale; individual elements may rather be illustrated in an exaggerated size for the purpose of better understanding.

Shown are in:

FIGS. 1A to 1O, FIGS. 3A to 3D, FIGS. 5A to 5C, FIGS. 6A to 6H and FIGS. 8A to 8C show method steps for mirror-coating outside surfaces of optical components and for producing optoelectronic semiconductor bodies according to various embodiments;

FIGS. 2A to 2G, FIGS. 4A to 4C, FIGS. 7A to 7B and FIG. 9 show optoelectronic semiconductor bodies in a cross-sectionals view and in a top view according to various embodiments.

DETAILED DESCRIPTION OF ILLUSTRATIVE EMBODIMENTS

Figure 1M:
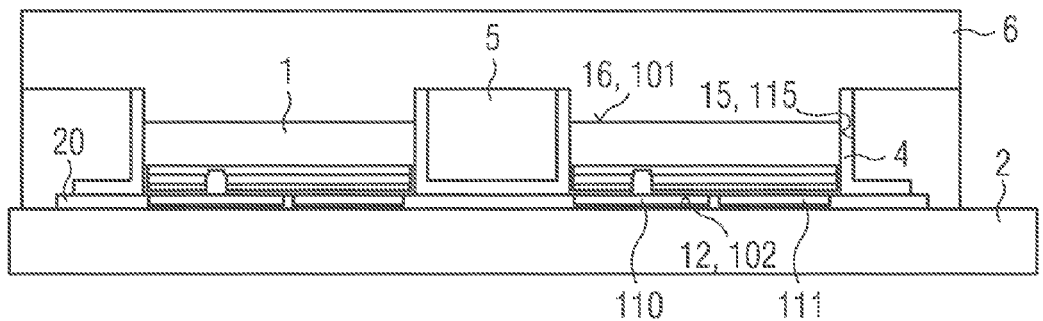

FIG. 1A shows a method step, in which a multitude of optical components 1 is provided. The optical components 1 include in each case a front side 16 and a rear side 12 located opposite the front side 16.

Each component 1 of FIG. 1A is formed by a semiconductor chip 100, which comprises a contact side 102 and a radiation side 101. The radiation side 101 is located opposite the contact side 102. In the present case, the radiation side 101 of each semiconductor chip 100 is identical to the front side 16, the contact side 102 is identical to the rear side 12.

In the present case, the semiconductor chips 100 each comprise a growth substrate, e.g., made of sapphire. In each case one semiconductor layer sequence 114, e.g., based on AlInGaN, is grown on to the growth substrate 113. The growth substrate 113 forms the stabilizing component of the semiconductor chip 100. Moreover, contact elements 110, in serving to electrically contact the semiconductor layer sequence 114 during operation are applied on to the contact side 102 facing away from the growth substrate 113. The first contact element 110 is connected to an n-type or p-type layer of the semiconductor layer sequence 114 via a through-connection, and the second contact element iii contacts a further semiconductor layer of the semiconductor layer sequence 114.

In FIG. 1A, the individual components 1 and semiconductor chips 100, respectively, are arranged directly next to one another and, e.g., comprise a common, contiguous growth substrate 113.

The method step of FIG. 1B shows the way how the individual semiconductor chips 100 are applied on to an intermediate carrier 22. Furthermore, it is shown how the individual semiconductor chips 100 are separated from one another and singulated through the growth substrate 113. Singulation can be affected by means of a laser separation process or a sawing process or a scoring process followed by a break process. The roughness on the flanks of the growth substrate 113 formed by the separation method is, e.g., 10 nm at most.

In the method step of FIG. 1C, it is also shown how the sacrificial layer 3 is applied on to the front side 16 of the components 1. First, the sacrificial layer 3 is formed contiguously and continuously and covers all front sides 16 of the components 1. The sacrificial layer 3 is based on a plastic or a photoresist, for example. In FIG. 1C, the sacrificial layer 3 is also separated along separation planes between the individual semiconductor chips 100, so that each component 1 comprises a distinct sacrificial layer 3 on the front side 16.

FIG. 1D shows the same method step as FIG. 1C, except for the fact that in this case, the sacrificial layer 3 is not separated along separation planes. The sacrificial layer 3 remains as an integral and contiguous layer on all front sides 16 of the components 1.

FIG. 1E shows a method step subsequent to FIG. 1D, in which the sacrificial layer 3 is expanded in lateral direction toward the front sides 16, so that the components 1 are separated laterally from one another. Furthermore, it can be seen in FIG. 1E that the optical components 1 comprise side surfaces 15 extending transversally to the front side 16 and the rear side 12, these side surfaces presently formed by side surfaces 115 of the semiconductor chips 100.

In FIG. 1F, the sacrificial layer 3 is separated between the components 1, wherein subsequently each component 1 comprises a distinct, unambiguously assigned sacrificial layer 3 at the front side 16 after that. In FIG. 1F, the sacrificial layer 3 projects above the component 1 in all lateral directions.

FIG. 1G shows another method step, in which the components 1 are detached from the intermediate carrier 22 and attached to a carrier 2, such as a glass carrier. In this case, the contact sides 12 in each case face the carrier 2.

Furthermore, a connection layer 20, e.g., of a thermoplastic material, is arranged on the carrier 2, into which the contact elements 110, 111 are pressed, in particularly completely pressed. The connecting layer 20 serves to protect the contact elements 110, 111 in further method steps.

In contrast to FIG. 1F, the sacrificial layers 3 on each component 1 do not project above the component 1 in the lateral direction. This can, e.g., be achieved in that the components 1 are separated from one another following a method step as shown in FIG. 1C. In this case, a previous expansion of the connecting layer 3 has not occurred. Moreover, FIG. 1G shows that the sacrificial layers 3 also comprise in each case side surfaces 35, which extend transversally to the front side 16 of the components 1.

FIG. 1H shows a method step following the method step of FIG. 1G, in which a mirror layer 4 is applied on to the sacrificial layer 3 and all sides of the components 1 not covered by the sacrificial layer 3 and by the carrier 2. In this case, the mirror layer 4 is applied on to all components 1 and extends contiguously, continuously and without interruptions also between the components 1. The mirror layer 4 covers all sides of the sacrificial layer 3 and of the components 1 exposed in FIG. 1G, in particular completely.

For example, the mirror layer 4 can be applied via a sputtering process or vapor deposition or atomic layer deposition (ALD). For example, the mirror layer consists of a metal such as Ag or Al. The layer thickness of the completed mirror layer 4 is, e.g., between 50 nm and 500 nm, inclusive. Furthermore, the mirror layer 4 has a reflectivity for electromagnetic radiation emitted by the semiconductor chips 100 of at least 90%.

In the method step in FIG. 1I, a potting material, e.g., in the form of a white plastic material, is introduced onto and between the components 1. The potting material 5 covers the components 1 and the mirror layer 4 located thereon in a form-fit manner on all side surfaces 15 and the front side 16. In this case, the potting material preferably is in direct contact with the mirror layer 4. The potting material 5 can be introduced, e.g., by an injection-molding process or a transfer-molding process.

FIG. 1J shows another method step, in which the sacrificial layer 3 is ground together with the potting material 5 located at the same height. The mirror layer 3 located on the sacrificial layer 3 is also removed. After the grinding process, a remainder of a sacrificial layer 3 remains on the front sides 16 of the components 1 and a potting material 5 terminating flush with the sacrificial layer 3. In this case, the potting material 5 facilitates the grinding process for removing the sacrificial layer 3.

FIG. 1K shows another method step, in which the remaining sacrificial layer of FIG. 1J is removed from the components 1 by means of a wet-chemical process, so that the front-sides 16 of the components 1 or the radiation sides 101 of the semiconductor chips 100 are exposed.

FIG. 1L shows an alternative to FIG. 1J, in which the sacrificial layer in each case laterally projects beyond the components 1. A potting material 5 is in turn arranged between the components 1.

FIG. 1M shows a method step, in which a converter element 6 is applied on to the front sides 16. In this case, first the converter element 6 is formed integrally and encloses all optical components 1 and the potting material 5 located there between. For example, the converter element 6 can be applied on to the components 1 by means of a spraying process and comprises, e.g., a thickness of between 20 μm and 70 μm inclusive.

Figure 1N:
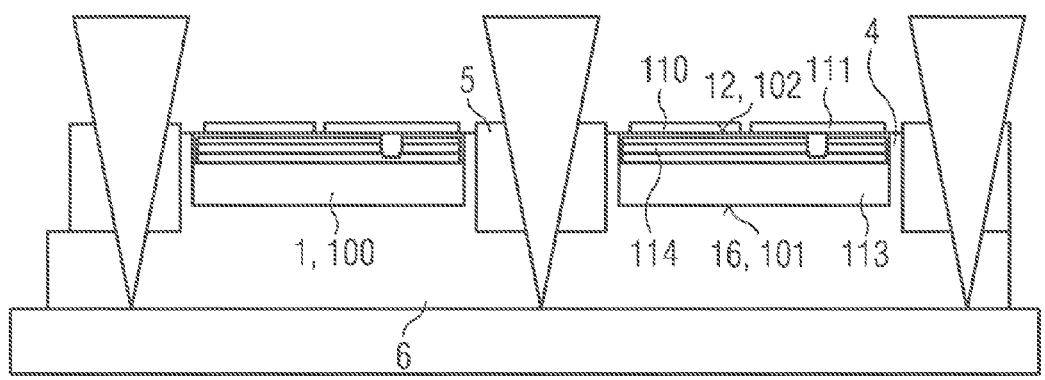

In the method step of FIG. 1N, the components 1 mirror-coated laterally are removed from the carrier 2 and applied on to an auxiliary carrier. In this case, the contact sides 12 with the contact elements 110, 111 face away from the auxiliary carrier. In FIG. 1N, the components 1 are separated from one another along separation planes through the potting material 5 and the converter element 6, so that individual surface-mounted semiconductor bodies result.

Figure 1O:
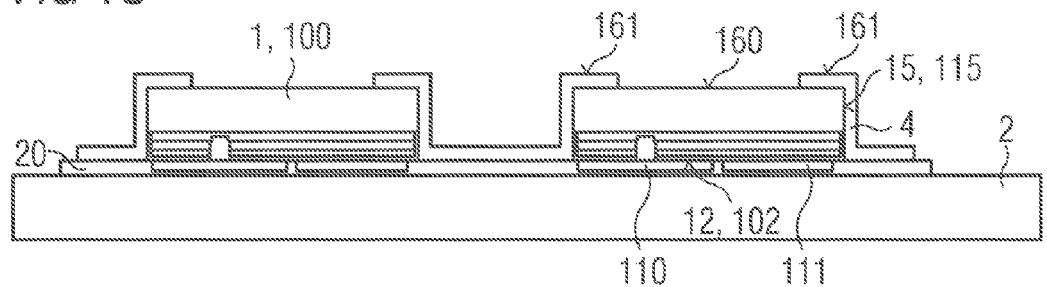

FIG. 1O shows an alternative method step, in which in contrast to the preceding method steps, after removing the sacrificial layer 3, the front sides 16 or the radiation sides 101 are not completely free from the mirror layer 4. Rather, only an inner region 160 of the front sides 16 is free from the mirror layer 4, a respective outer edge 161 of the front sides 16, which, e.g., completely surrounds the inner region 160, is covered with the mirror layer. In this way, e.g., the radiating surface (area) of the semiconductor chips 100 can be defined.

FIG. 2A shows an exemplary embodiment of a surface-mounted optoelectronic semiconductor body 1000 in a cross-sectional view. Again, a semiconductor chip 100 as described above can be discerned, which is completely covered with the mirror layer 4 on side surfaces 115 extending transversally to the contact side 102 and to the radiation side 101. The contact elements 110, 111 on the contact side 102 are not covered by the mirror layer 4, but are exposed. Furthermore, the mirror layer 4 projects beyond the semiconductor chip 100 at the radiation side 101 in the direction away from the radiation side 101. An optical element 8 in the form of a converter element 6 is arranged on the radiation side 101, which terminates flush with the mirror layer 4 in the lateral direction parallel to the radiation side 101, is in direct contact with the mirror layer 4 and the semiconductor layer 100 and surrounds the mirror layer 4 and the radiation side 101 in a form-fit manner.

FIG. 2B shows another exemplary embodiment of an optoelectronic semiconductor body 1000, in which in contrast to FIG. 2A, a potting material 5 is applied on side surfaces 115 of the semiconductor chips 100, e.g., in the form of a white plastic. The potting material 5 covers the mirror layer 4 and projects beyond the semiconductor chip 100 also in the direction away from the radiation side 101. The converter element 6 is in direct contact with the potting material 5 and, in the lateral direction, terminates flush with the potting material 5.

The potting material 5 can laterally completely surround the semiconductor chip 100 on the side surfaces 115 and serves, e.g., as an additional reflective coating around the semiconductor chip 100.

Furthermore, contact structures 1100 and 1110 are attached on the contact sides 102 in FIG. 2B, which are electrically-conductively connected to the contact elements 110 and iii and overlap with the potting material 5 in the vertical direction, transversally to the lateral direction.

FIG. 2C shows an exemplary embodiment of an optoelectronic semiconductor body 1000, in which the mirror layer 4 applied on to the side surfaces 115 terminates flush with the semiconductor chip 100 at the radiation side 101. The mirror layer 4 is directly applied on to the semiconductor chip 100, or in other words is in direct contact with the chip.

In the exemplary embodiment of FIG. 2D, an optoelectronic semiconductor body 1000 is shown, in which a first passivation layer 40, e.g., made of $SiO_2$ or ZnO, is applied between the mirror layer 4 and the semiconductor chip 100, in contrast to FIG. 2C. The first passivation layer 40 is preferably transparent, in particular clear-sighted, for electromagnetic radiation emitted by the semiconductor chip 100 and completely covers both the side surfaces 115 and the radiation side 101 of the semiconductor chip 100. Preferably, the refractive index of the first passivation layer deviates from the refractive index of the sapphire growth substrate 113 by less than 0.1.

In addition, the mirror layer 4 is surrounded on all sides by a second passivation layer 41, which protects the mirror layer 4 from external influence. The second passivation layer 41 is, e.g., made of SiN or a layer sequence made of $Al_2O_3$ and $HMDSO:O_2=1:1.002$. For example, the $Al_2O_3$ layer has a thickness of 93 nm, the HDMSO layer has a thickness of 3 μm, for example.

In the exemplary embodiment of FIG. 2E, in contrast to FIG. 2D, no first passivation layer 40 is attached between the mirror layer 4 and the semiconductor chip loft 100

FIG. 2F shows an exemplary embodiment of an optoelectronic semiconductor body 1000, in which the mirror layer 4 is not only attached on side surfaces 115 of the semiconductor chip 100, but also partially covers the radiation side 101. In particular, the mirror layer 4 forms a surrounding frame on the radiation side 101.

The exemplary embodiment of FIG. 2F is shown in a plan view of the radiation side 100 in FIG. 2G. It can be discerned that the mirror layer 4 is attached on an outer edge 161 of the radiation side 101, an inner region 160 surrounded by the outer edge 161 is free from the mirror layer 4. The inner region 160 is formed as a circular region, which, e.g., defines a radiation exit surface of the radiation emitted by the semiconductor chip 100.

FIG. 3A shows a method step for mirror-coating optical components, in which in contrast to the exemplary embodiments of FIG. 1, the rear sides 12 of the components 1 are formed by the radiation sides 101 of the semiconductor chips 100, the contact sides 102 of the semiconductor chips 100 form the front sides 16. The rear sides 12 or the radiation sides, respectively, face the carrier 2. The sacrificial layer 3 is applied on to the front sides 16 or the contact sides 102 with the contact elements 110, 111. The sacrificial layer 3 presently is, e.g., a photoresist such as a dry resist, which can be patterned by means of a photolithographic process in a later step.

FIG. 3B shows a method step, in which the sacrificial layer 3 was patterned in such a way that the contact sides 102 are not completely covered by the sacrificial layer 3 but are free from sacrificial layer 3 in an edge region 121. The edge region 121 borders edges 122 of the semiconductor chip 100. Moreover, FIG. 3B shows how the mirror layer 4 is applied on to the sacrificial layer 3, the side surfaces 115 and the edge region 121.

The method step of FIG. 3C shows semiconductor chips 100 after the removal of the sacrificial layer 3. It can be discerned now that the contact sides 102 are covered with the mirror layer 4 in the edge region 121. This is advantageous, since radiation emitted by the semiconductor chips 100 during the operation can hardly or not at all emerge from the semiconductor chip 100 via the contact side 102.

FIG. 3D shows similar semiconductor chips 100 as in FIG. 3C, except for the fact that in this case, the edge region 121, in which the contact side 102 is covered with the mirror layer 4, extends as far as on to the contact elements 110, 111. Thus, the contact elements 110, 111 are also partially covered by the mirror layer 4.

Figure 4A:
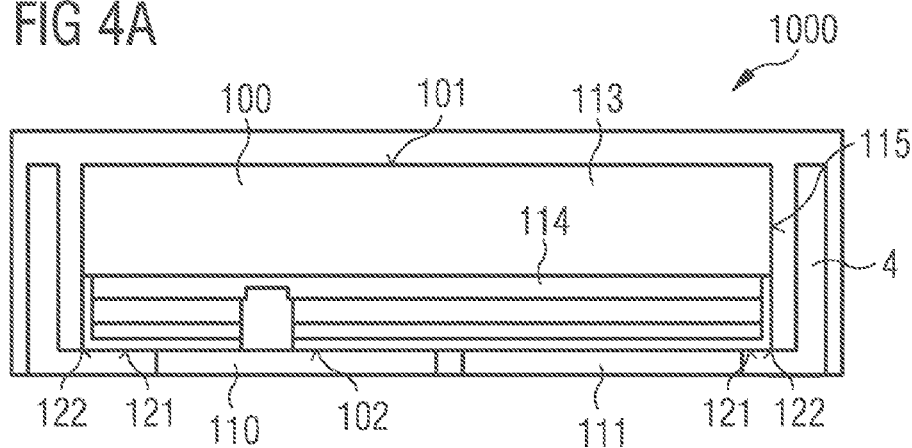

FIG. 4A shows an optoelectronic semiconductor component 1000, which is produced by means of the method steps of FIGS. 3A to 3C, for example. In particular, it can be taken from FIG. 4 that the mirror layer 4 covers an edge region 121 of the contact side 102. The width of the edge region 121 is at least 5 μm, for example. The contact elements 110, 111 are placed back from the edge 122 of the contact side 102 as far as the contact elements 110, 111 are not covered by the mirror layer 4.

Figure 4B:
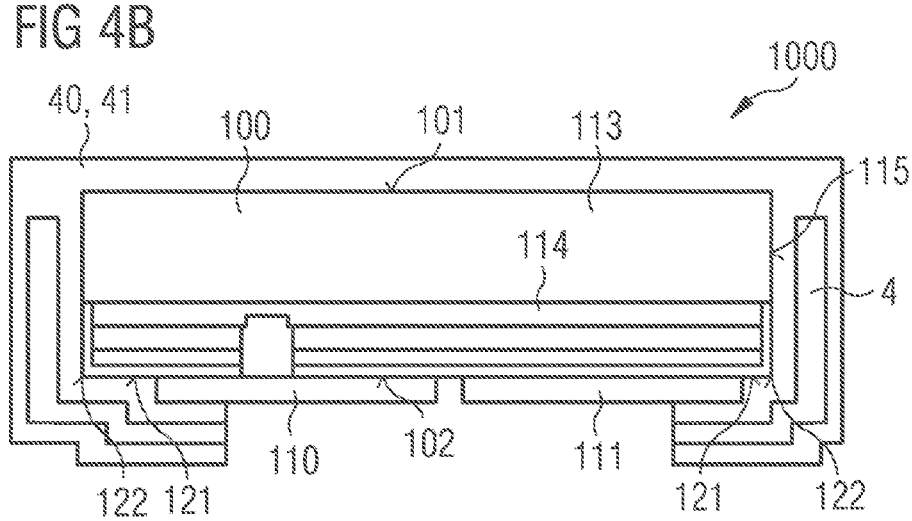

In contrast to FIG. 4A, FIG. 4B shows that the mirror layer 4 is placed back on to the contact side 102 as far as the mirror layer 4 also covers part of the contact elements 110, 111. For protection against short-circuits, a previously-applied passivation layer 40, 41 is arranged between the mirror layer 4 and the contact elements 110, 111.

Figure 4C:
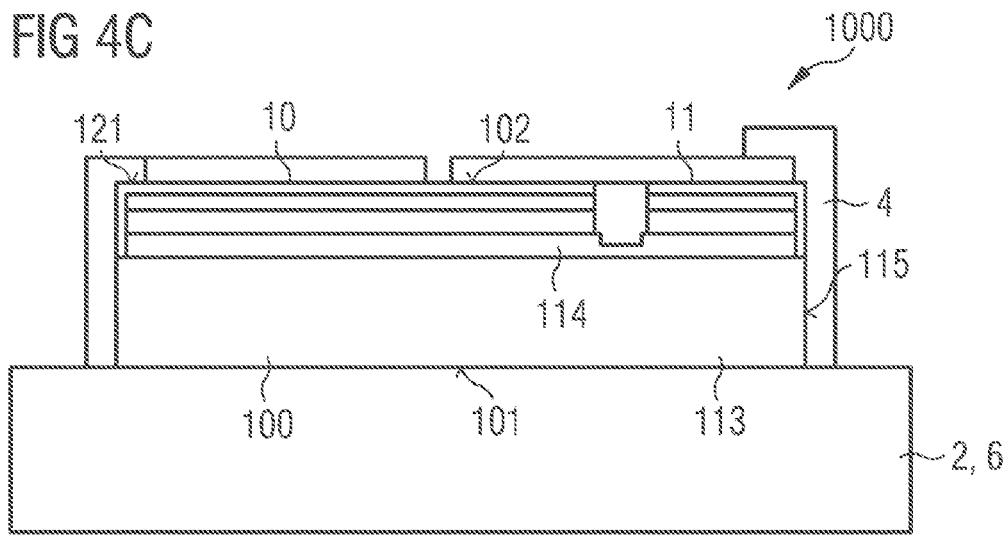

The exemplary embodiment of FIG. 4C essentially shows the same optoelectronic semiconductor body 1000 as in FIGS. 4A and 4B. In contrast to FIGS. 4A and 4B, the radiation side 101 has a converter element 6 applied thereon. Here, the converter element 6 forms part of the carrier 2 of FIG. 3, on to which the semiconductor chips 100 were previously applied for mirror-coating.

Figure 5A:
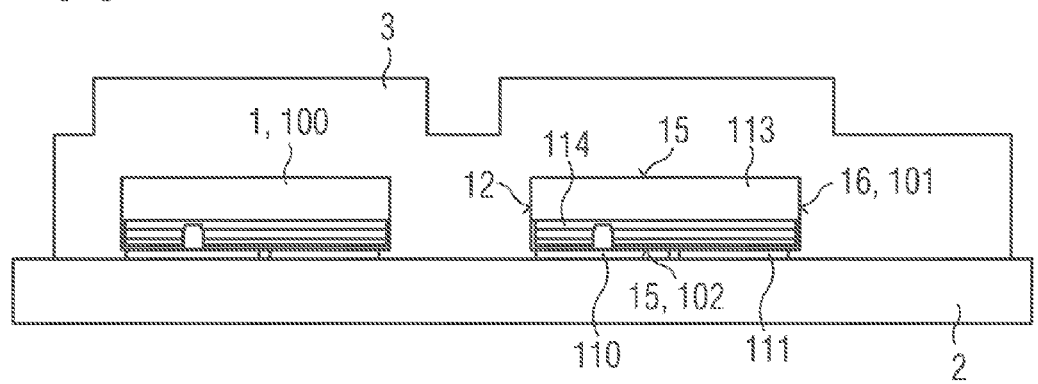

FIG. 5A shows an alternative method step for mirror-coating optoelectronic components 1. Here, optical components 1 in the form of semiconductor chips 100 are applied on to a carrier 2 with the contact sides 102 thereof. Also, the semiconductor chips 100 are completely covered by a photoresist. In FIG. 5A, the contact sides 102 of the semiconductor chips 100 in each case form a side surface 15 of the optical component 1. Accordingly, the front side 16 of each component 1 extends transversely to the carrier 2. The front side 16 at the same time forms the radiation side 101 of the semiconductor chip 100.

Figure 5B:
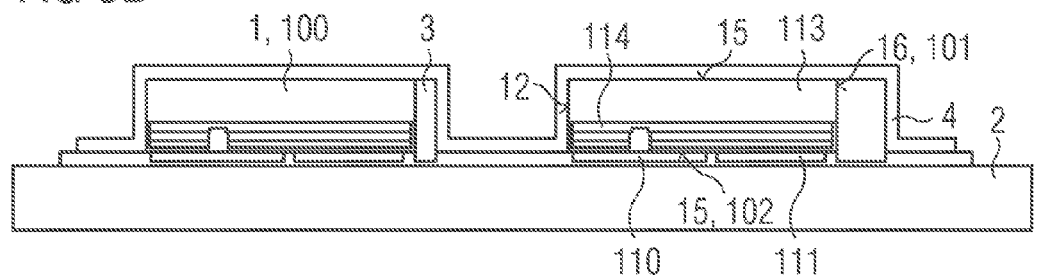

In the method step of FIG. 5B, the photoresist has been structured by a lithographic process to such an extent, that only a sacrificial layer 3 remains on the front side 16 of the components 1. Furthermore shown is the way how a mirror layer 4 is applied on to all sides of the semiconductor chips 100 that are not covered by the carrier.

Figure 5C:
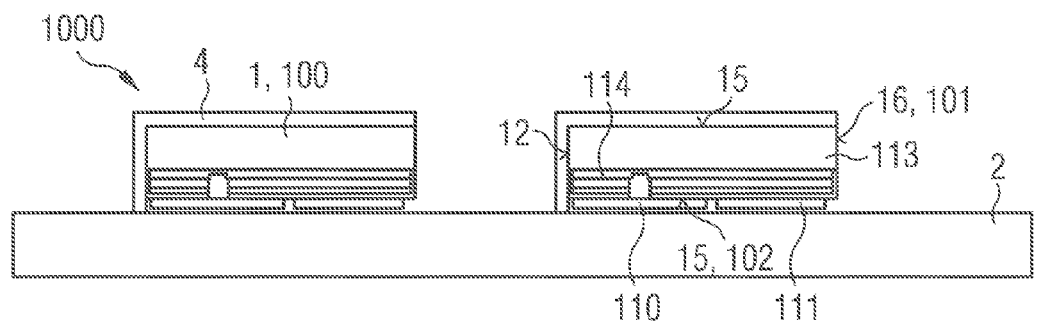

In the method step of FIG. 5C, the sacrificial layer 3 with the mirror layer 4 located thereon is removed from the front side 16. The resulting optoelectronic semiconductor bodies 1000 each comprise a semiconductor chip 100, the radiation exit surface 101 of which extends transversely to the contact side 102, wherein all other sides of the semiconductor chip 100 that do not form the radiation exit surface 101 or the contact layer 102, are mirror-coated by the mirror layer 4. Among experts, such semiconductor bodies 1000 are called sidelookers.

FIGS. 6A to 6E basically show the same method steps as FIG. 1G to 1N. In contrast to the exemplary embodiments of FIG. 1, the optical components 1 of FIG. 6 each comprise a semiconductor chip 100 and an optical element 8 applied on to the radiation side 101. The contact side 102 having the contact elements 110, 111 and located opposite the radiation side 101 faces the carrier 2. The side surfaces 15 of the optical components 1 are formed by side surfaces 115 of the semiconductor chips 100 and side surfaces 85 of the optical elements 8. The front sides 16 are in each case formed by a side of the optic elements 8 that faces away from the semiconductor chips 1000.

In the present case, the optical element 8 is, e.g., a glass cylinder provided for beam guiding of an electromagnetic radiation emerging from the radiation side 101 of the semiconductor chip 100. The optical element 8 can alternatively also be a converter element 6 or a lens, for example.

Figure 6A:
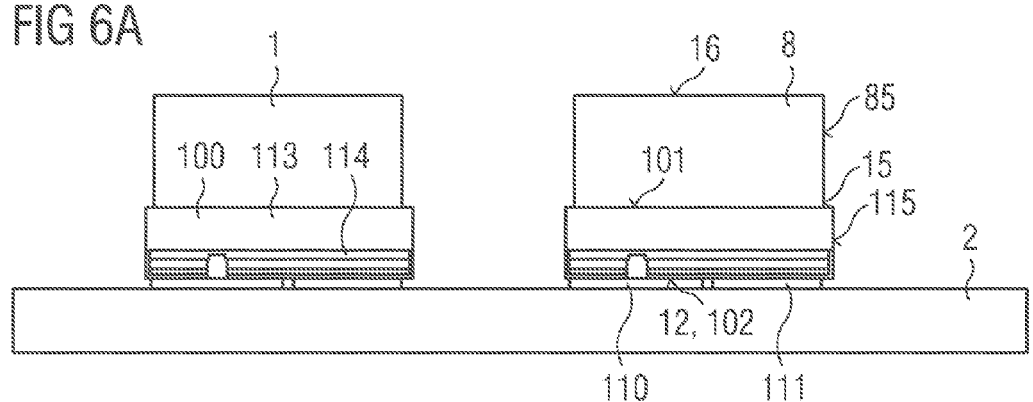
Figure 6B:
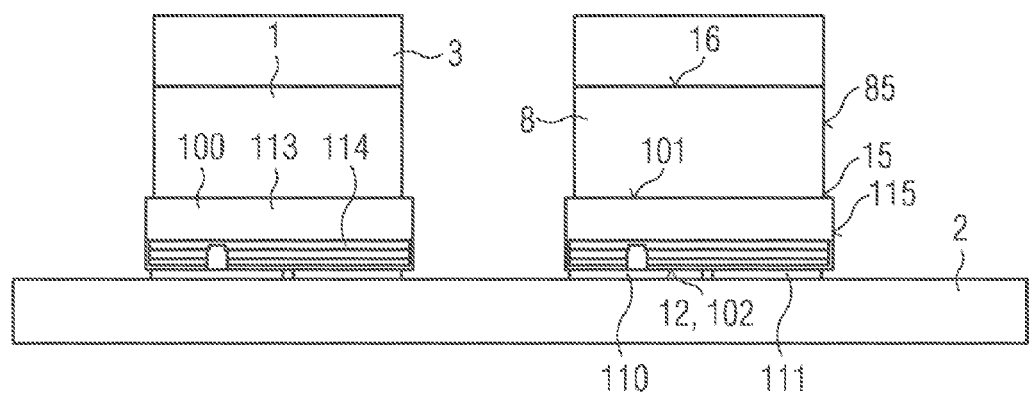

In the method step of FIG. 6B, the sacrificial layer 3 is applied on to front sides 16 of the optical components 1.

Figure 6C:
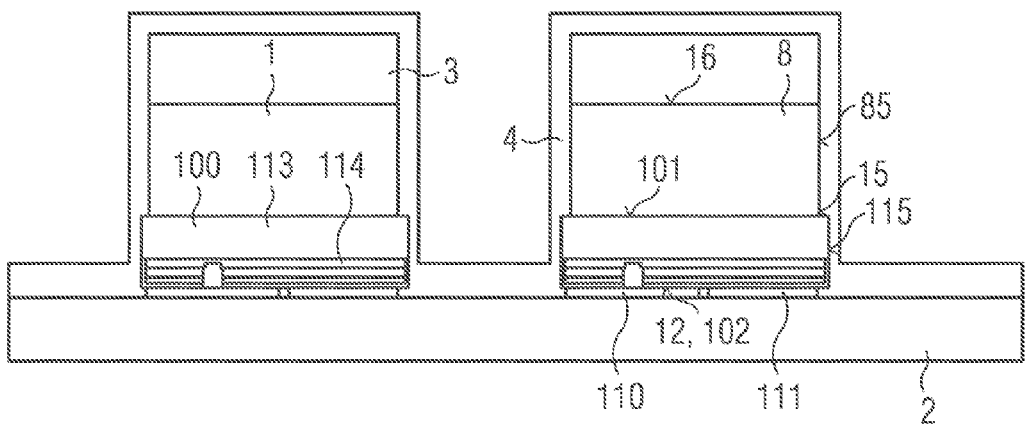

In the method step of FIG. 6C, both the sacrificial layer 3 and the components 1 are covered by a mirror layer 4. Here, the mirror layer 4, partially or completely, covers both the side surfaces 115 of the semiconductor chips 100 and the side surfaces 85 of the optical elements 8.

Figure 6D:
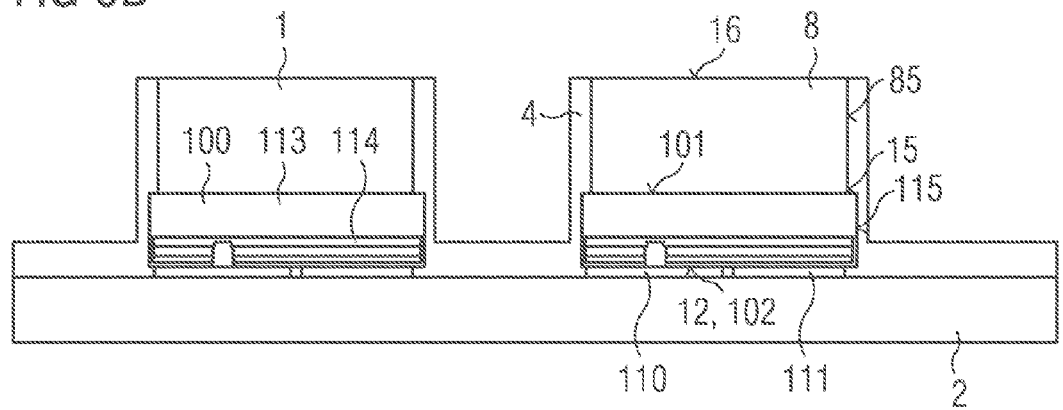

In FIG. 6D, the sacrificial layer 3 on the components 1 is removed by means of one of the methods described above, such that front sides 16 formed by the optical elements 8 are exposed.

Figure 6E:
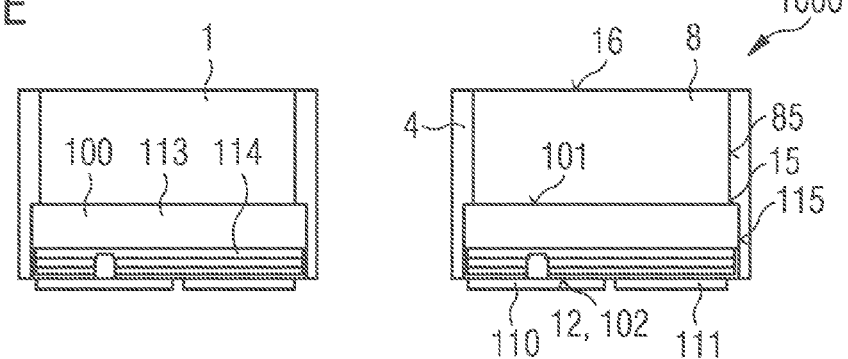

In FIG. 6E, the carrier 2 is removed from the semiconductor chips 100 in such a way that singulated optoelectronic semiconductor bodies 1000 are formed.

Figure 6F:
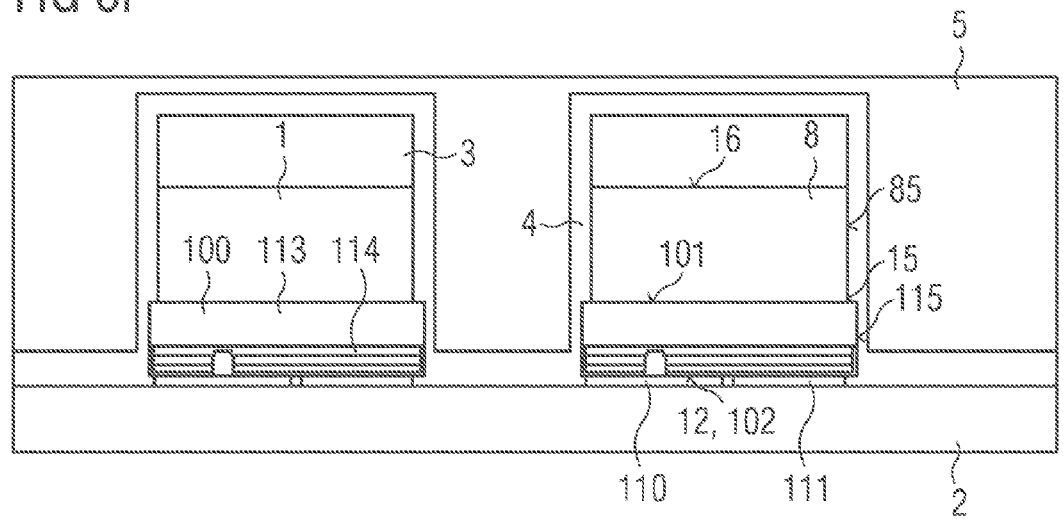
Figure 6G:
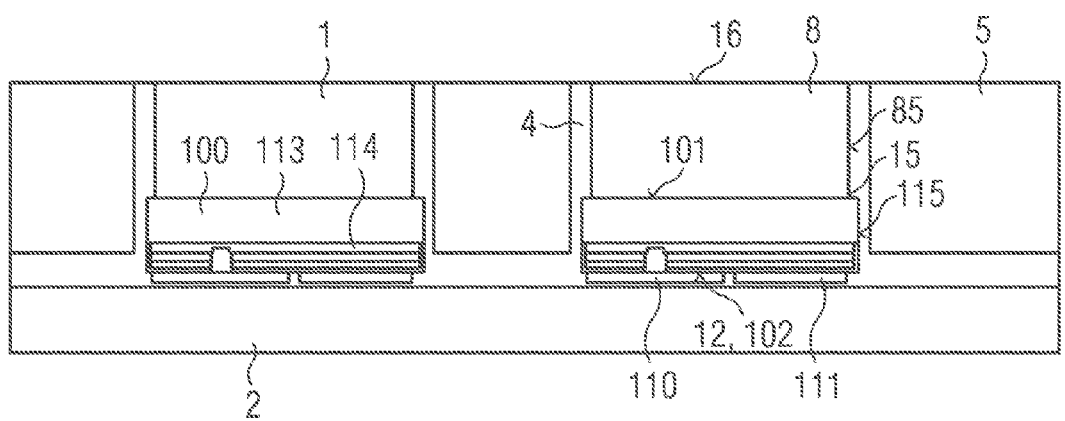
Figure 6H:
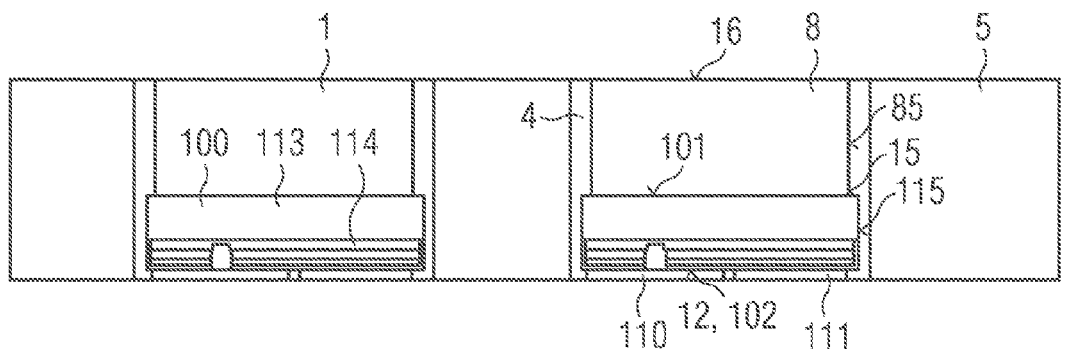

FIGS. 6F to 6H show the same method steps as in the above FIGS. 6C to 6E. In addition, FIGS. 6F to 6H have a potting material 5 attached between the optical components 1, wherein the potting material 5 completely covers the components 1 having the semiconductor chips 100 and the optical elements 8 laterally. In this case, the potting material 5 can also simplify a grinding process for removing the sacrificial layer 3.

FIG. 7A shows an exemplary embodiment of an optoelectronic semiconductor body 1000 in a cross-sectional view. The semiconductor body 1000 corresponds to the semiconductor body 1000, for example, which has been produced in the method step of FIG. 6E. It is discernible here that the side surfaces 115 of the semiconductor chip 100 and the side surfaces 85 of the optical element 8 are completely covered by the mirror layer 4 on their outer side. A contact side 102 and a side of the optical element 8 and opposite the contact side 102 are free of the mirror layer 4.

FIG. 7B also shows an exemplary embodiment of an optoelectronic semiconductor body 1000, which, in contrast to FIG. 7a, has a potting material 5 arranged on the mirror layer 4 and completely covers the mirror layer 4. The potting material 5 can be a white plastic, e.g., a silicone blended with titanium oxide particles.

Contact structures 1100, 1110 are furthermore arranged on the contact side 102 of the semiconductor chip 100 and electrically-conductively connected to the contact elements 110 and 111. Here, contact structures 1100, 1110 overlap at least partially with the potting material 5 in the vertical direction.

Figure 8A:
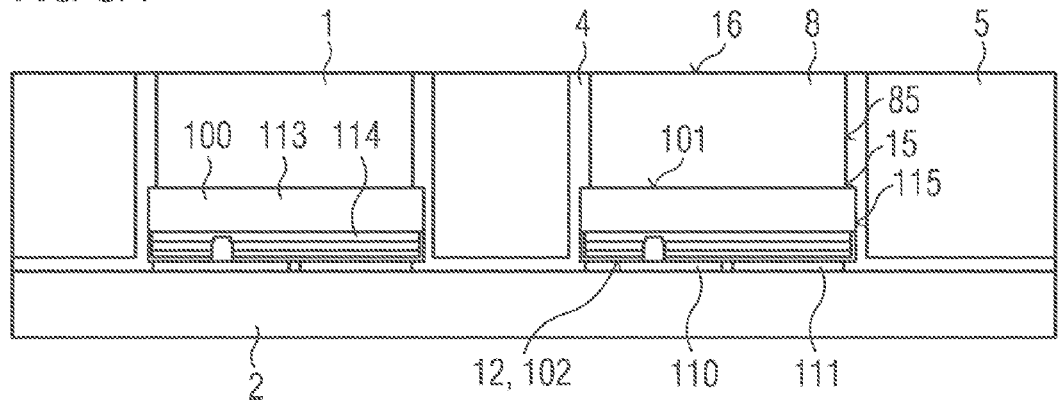
Figure 8B:
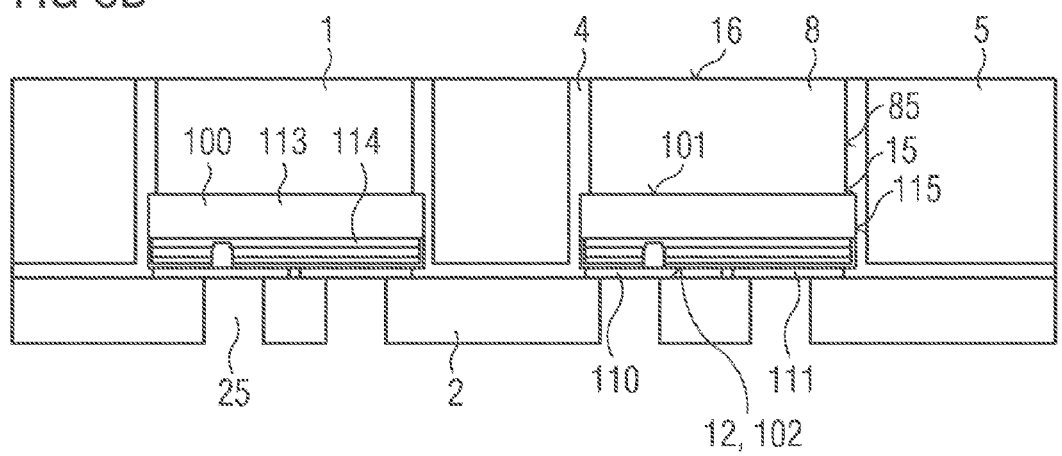
Figure 8C:
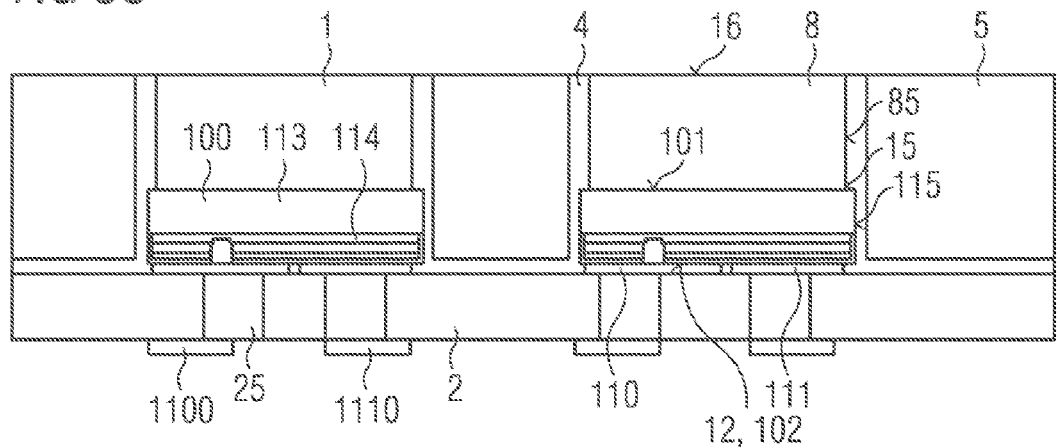

FIGS. 8A to 8C show method steps which can be subsequent to the method step shown in FIG. 6G. In FIG. 8B, the carrier 2 is structured in such a way, e.g., by means of a laser, that through-connections 25 are formed within the carrier 2 and overlap with contact elements 110 and 111 in the vertical direction.

In FIG. 8C, the through-connections 25 are subsequently filled with an electrically-conductive material, a metal or a semiconductor material, for example. In addition, contact structures 1100, 1110 are applied on to a lower side of the carrier 2 and facing away from the semiconductor chips 100, which contact structures overlap with the through-connections 25 in the vertical direction. Contact structures 1100, 1110 are electrically-conductively connected to contact elements 110, 111 of the semiconductor chips 100 via the through-connections 25.

Figure 9:
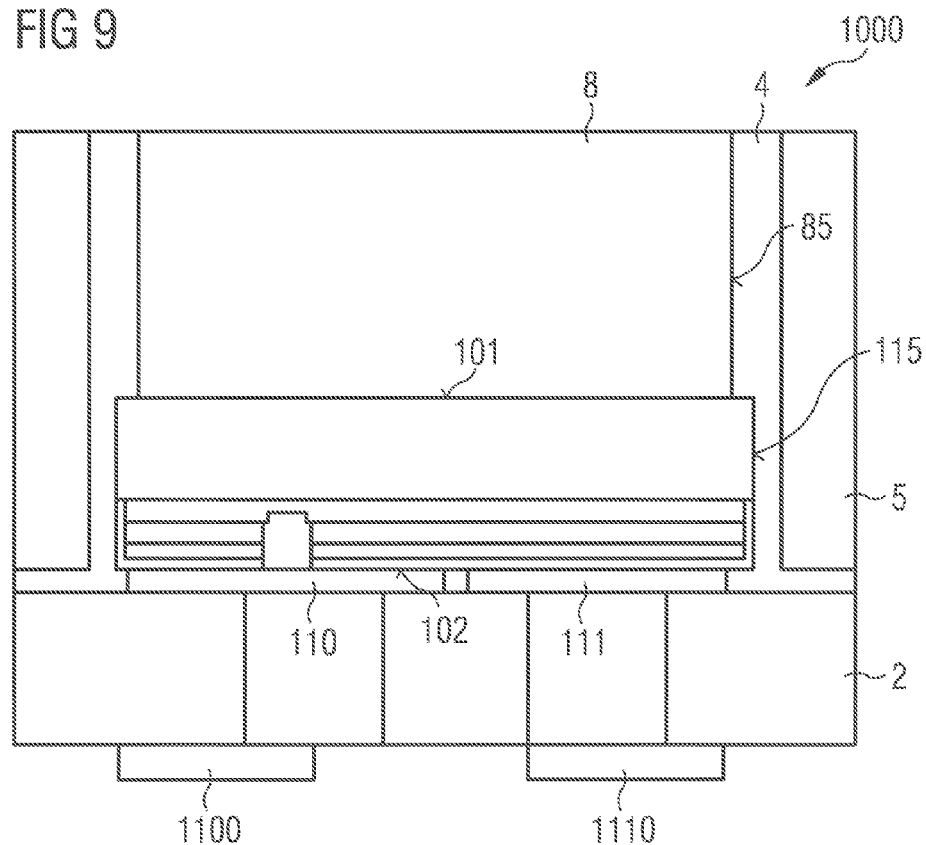

The exemplary embodiment of FIG. 9 shows an optoelectronic semiconductor body 1000 resulting after singulation of the semiconductor chips 100 of FIG. 8C. Here, singulation is affected along separating planes through the potting material 5 and the carrier 2. In contrast to the preceding exemplary embodiments, FIG. 9 shows the carrier 2 as a part of the completed optoelectronic semiconductor body 1000.

Figure 10:
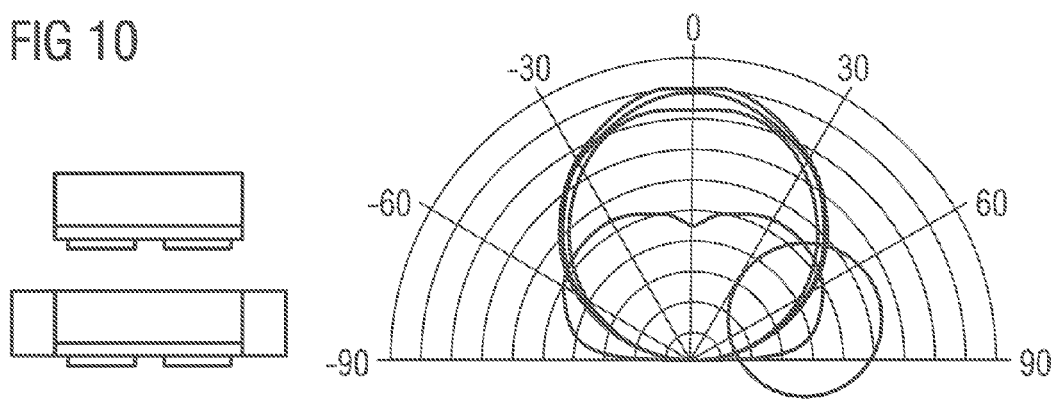
FIG. 10 shows radiation characteristics of various optoelectronic semiconductor bodies.

FIG. 10 shows an emission spectrum of optoelectronic semiconductor bodies. Two optoelectronic semiconductor bodies are compared with each other, each comprising a volume semiconductor chip. If the volume semiconductor chip is not laterally covered by a mirror layer, electromagnetic radiation can emerge from the lateral surface of the semiconductor chip. In contrast, if the lateral surfaces are provided with a mirror, as made possible by the method described herein, the radiation is in particular only emitted via a radiation exit surface of the semiconductor bodies such that a particularly focused light emission with almost Lambertian radiation characteristics is achieved.

The invention is not limited to the exemplary embodiments by the description using these exemplary embodiments. The invention rather comprises any new feature and any combination of features, which in particular includes any combination of features in the claims, even if these features or this combination is per se not explicitly specified in the claims or in the exemplary embodiments.

The invention claimed is:

1. A method for mirror-coating outside surfaces of optical components for use in optoelectronic semiconductor bodies, the method comprising:
   A) arranging a plurality of optical components on a carrier, wherein each component comprises a front side, a rear side located opposite the front side, and side surfaces extending transversally to the front side;
   B) applying a sacrificial layer to each component so that the front side of each component is at least partly covered by the sacrificial layer and so that the side surfaces of each component partially stay free of the sacrificial layer;
   C) applying a mirror layer to the components so that the mirror layer at least partly covers the sacrificial layer and all other sides of each component that are not covered by the carrier; and
   D) removing the sacrificial layer and the mirror layer located thereon from the front side of each component, wherein the mirror layer remains on the other sides of the components.

2. The method according to claim 1, wherein the rear sides of the components face the carrier, the method further comprising:

after step C) and prior to step D), arranging a potting material in regions between the components so that the potting material laterally encloses the side surfaces and the mirror layer applied thereon of each component in a form-fit manner, wherein the potting material projects above the components in a direction away from the carrier and at least partly covers side surfaces of the sacrificial layer, and wherein the sacrificial layer is ground together with the potting material located at the same height above the carrier; and after step D), removing the components from the carrier and singulating the component from another.

3. The method according to claim 1, wherein the sacrificial layer is a photoresist, the method further comprising:
prior to step C), patterning the photoresist by a lithographical process, thereby defining regions of the components that subsequently are to be free from the sacrificial layer and be mirror-coated with the mirror layer in step D); and
removing the sacrificial layer from the components together with the mirror layer by a wet-chemical process.

4. The method according to claim 1, wherein the sacrificial layer in each case only covers an inner region of the front side of each component, wherein an outer edge of the front side surrounding the inner region remains free of the sacrificial layer, and wherein the mirror layer is applied on to the outer edge and remains on the outer edge after step D).

5. The method according to claim 1, wherein each component comprises an optoelectronic semiconductor chip with a contact side and a radiation side different from the contact side, wherein on the contact side, contact elements for electrically contacting the semiconductor chip are attached, wherein electromagnetic radiation is coupled into or coupled out of the semiconductor chip via the radiation side during operation, and wherein the contact side of the semiconductor chip corresponds to the rear side or the front side or one of the side surfaces.

6. The method according to claim 5, wherein a connecting layer is applied on to the carrier, wherein the connecting layer comprises a thermoplastic material, wherein the contact side of the semiconductor chip in each case corresponds to the rear side or one of the side surfaces of the components, and wherein, during step A), the contact sides of the semiconductor chips are face the carrier and the contact elements are pressed into the connecting layer so that the contact elements in step C) are protected from being covered with the mirror layer.

7. The method according to claim 5, wherein the contact side of the semiconductor chips in each case correspond to the front side of the components, wherein during step A), the contact sides of the semiconductor chips face away from the carrier, wherein the sacrificial layer in step D) is applied on to the contact sides in such a way that in each case an edge region of the contact sides adjacent to side surfaces of the semiconductor chips remains free of the sacrificial layer, wherein, after step D), a mirror layer is in one piece and contiguously remains on each semiconductor chip, and wherein the mirror layer in each case covers the side surfaces of the semiconductor chip and the edge region of the contact side.

8. The method according to claim 7, wherein the carrier is a converter element, and wherein the semiconductor chips are attached to the carrier in a mechanically stable and permanent manner.

9. The method according to claim 8, wherein the contact elements are placed back by at least 5 µm from chip edges formed between the side surfaces of the semiconductor chip and a contact surface, and wherein the mirror layer, after step D), extends all the way to the contact elements and covers a part of the contact elements.

10. The method according to claim 5, wherein each component includes an optical element besides the semiconductor chip, wherein the optical element is arranged on the radiation side and configured to convert radiation and/or guide radiation, wherein the contact side of the semiconductor chip corresponds to the rear side or one of the side surfaces, wherein the front side of the component is formed by a side of the optical element facing away from the semiconductor chip, and wherein, in step C), besides side surfaces of the semiconductor chip, side surfaces of the optical element extending transversally to the front side are also coated with the mirror layer.

11. The method according to claim 10, wherein the optical element is a light outcoupling element, and wherein the light outcoupling element couples electromagnetic radiation generated by the semiconductor chip into a light guide.

12. The method according to claim 1, further comprising:
prior to step C), applying a first passivation layer to the components so that the first passivation layer prevents direct mechanical contact between the mirror layer and the components; and
after step D), applying a second passivation layer to the components, wherein the second passivation layer encapsulates the mirror layer completely.

13. A surface-mountable optoelectronic semiconductor body comprising:
a semiconductor chip having a radiation side and a contact side different from the radiation side, wherein contact elements for electrically contacting the semiconductor body are attached to the contact side, and wherein the contact elements are freely accessible; and
a metal mirror layer disposed on the semiconductor chip, wherein the metal mirror layer has a reflectivity of at least 80% to radiation emitted by the semiconductor chip during operation, wherein the mirror layer is a continuous and contiguous mirror layer, which covers all sides of the semiconductor chip that are not the contact side and the radiation side by at least 95%, wherein the mirror layer is arranged at the semiconductor chip in a form-fit manner,
wherein the mirror layer is disposed on an edge region of the contact side adjacent to side surfaces of the semiconductor chip and covers the entire edge region, wherein, on the contact side, the edge region forms a continuous, contiguous edge without interruptions, which extends completely around the contact elements, and wherein the edge region has a width of at least 5 µm.

14. The optoelectronic semiconductor body according to claim 13, further comprising an optical element for converting radiation and/or guiding radiation, the optical element being disposed on the radiation side of the semiconductor chip, wherein the optical element terminates is flush with the mirror layer in a lateral direction parallel to the radiation side or laterally projects above the mirror layer and/or is per se mirrored with the mirror layer on side surfaces extending transversally to the radiation side.

15. The optoelectronic semiconductor body according to claim 14, wherein the contact side and the radiation side of the semiconductor chip are located opposite to one another, wherein the radiation side and the contact side are connected to one another via side surfaces of the semiconductor chip extending transversally to the radiation side, wherein a potting material with a layer thickness of at least 10 μm is disposed on the side surfaces of the semiconductor chip, wherein the mirror layer is located between the semiconductor chip and the potting material, wherein the potting material comprises white plastic, wherein the potting material and the mirror layer project above the semiconductor chip in a direction away from the radiation side, wherein the optical element is a converter element, which terminates flush with the potting material in the lateral direction, and wherein the converter element rests against the semiconductor chip and the potting material in a form-fit manner.

16. The optoelectronic semiconductor body according to claim 14, wherein the optical element is mirror-coated with the mirror layer on the side surfaces of the optical element extending transversally to the radiation side, wherein the regions of the radiation side not covered by the optical element are mirror-coated with the mirror layer, wherein the mirror layer covers all side surfaces of the optical element by at least 95%, and wherein the optical element is a light outcoupling element for guiding beams and is configured to couple electromagnetic radiation from the semiconductor chip into a light guide.

17. The optoelectronic semiconductor body according to claim 13, wherein the radiation side extends transversally to the contact side and borders the contact side, and wherein a main radiation direction of the semiconductor body extends parallel to the contact side.

18. A method for mirror-coating outside surfaces of optical components for use in optoelectronic semiconductor bodies, the method comprising:
  A) arranging a plurality of optical components on a carrier, wherein each component comprises a front side, a rear side located opposite the front side, and side surfaces extending transversally to the front side;
  B) applying a sacrificial layer to each component so that in each component the front side is at least partly covered by the sacrificial layer;
  C) applying a mirror layer to the components so that the mirror layer at least partly covers the sacrificial layer and all other sides of each component that are not covered by the carrier; and
  D) removing the sacrificial layer and the mirror layer located thereon from the front side of each component, wherein the mirror layer remains on the other sides of the components,
  wherein, in step A), the rear sides of the components are made to face the carrier,
  wherein, after step C) and prior to step D), a potting material is arranged in regions between the components so that the potting material laterally encloses the side surfaces and the mirror layer applied thereon of each component in a form-fit manner,
  wherein the potting material projects above the components in a direction away from the carrier and at least partly covers side surfaces of the sacrificial layer, and
  wherein, in step D), the sacrificial layer is first ground together with the potting material located at the same height above the carrier until a thickness of the sacrificial layer is at least 5 μm and subsequently the rest of the sacrificial layer is completely removed via a wet-chemical process.

* * * * *